United States Patent
Isogai et al.

(10) Patent No.: US 6,526,652 B2
(45) Date of Patent: Mar. 4, 2003

(54) APPARATUS FOR RESETTING PRINTED-WIRING-BOARD SUPPORTING DEVICE, AND PRINTED-WIRING-BOARD-RELATING-OPERATION PERFORMING SYSTEM

(75) Inventors: Takeyoshi Isogai, Hekinan (JP); Kimihiko Yasuda, Anjo (JP); Noriaki Iwaki, Hekinan (JP); Minoru Yoriki, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/915,383

(22) Filed: Jul. 27, 2001

(65) Prior Publication Data

US 2002/0014001 A1 Feb. 7, 2002

(30) Foreign Application Priority Data

Aug. 4, 2000 (JP) ........................................ 2000-237424

(51) Int. Cl.⁷ .............................................. B23P 19/00
(52) U.S. Cl. ............................. 29/740; 29/739; 29/743
(58) Field of Search ............................... 198/376, 346.2, 198/468.8; 29/740, 739, 741, 832, 712, 703, 743

(56) References Cited

U.S. PATENT DOCUMENTS

| | | | | |
|---|---|---|---|---|
| 3,367,476 A | * | 2/1968 | Aronstein et al. ............. | 198/33 |
| 4,615,089 A | * | 10/1986 | Wright ....................... | 29/33 K |
| 4,964,497 A | * | 10/1990 | Bundo et al. ................ | 198/341 |
| 5,067,648 A | * | 11/1991 | Cascini ..................... | 228/47 |
| 5,218,753 A | * | 6/1993 | Suzuki et al. ................ | 29/740 |
| 5,249,356 A | * | 10/1993 | Okuda et al. ................. | 29/833 |
| 5,539,975 A | * | 7/1996 | Kukuljan et al. .............. | 29/701 |
| 5,778,524 A | * | 7/1998 | Stridsberg .................... | 29/836 |
| 5,794,329 A | * | 8/1998 | Rossmeisl et al. ............. | 29/743 |
| 5,932,065 A | * | 8/1999 | Mitchell ..................... | 156/556 |
| 6,161,749 A | * | 12/2000 | Bastacky et al. ........... | 228/49.5 |
| 6,212,751 B1 | * | 4/2001 | Hattori ...................... | 29/407.04 |
| 6,346,154 B1 | * | 2/2002 | Briend ........................ | 118/500 |
| 6,374,729 B1 | * | 4/2002 | Doyle ......................... | 101/114 |
| 6,374,982 B1 | * | 4/2002 | Cohen et al. ............... | 198/346.2 |

FOREIGN PATENT DOCUMENTS

| | | |
|---|---|---|
| JP | 7-15189 | 1/1995 |
| JP | 7-93520 | 10/1995 |
| JP | 2792931 | 6/1998 |
| JP | 2824378 | 9/1998 |
| JP | 11-195899 | 7/1999 |
| JP | 11-204995 | 7/1999 |

OTHER PUBLICATIONS

U.S. patent application Ser. No. 09/892,516, Iwaki, filed Jun. 28, 2001, Atty. docket No. 109936.
U.S. patent application Ser. No. 09/915,536, Isogai et al., filed Jul. 27, 2001.
U.S. patent application Ser. No. 09/915,579, Isogai et al., filed Jul. 27, 2001.

* cited by examiner

*Primary Examiner*—Ira S. Lazarus
*Assistant Examiner*—K. B. Rinehart
(74) *Attorney, Agent, or Firm*—Oliff & Berridge, PLC

(57) ABSTRACT

An apparatus for automatically resetting a printed-wiring-board supporting device including a supporting table and at least one supporting member which is set on a supporting surface of the supporting table to support a back surface of a printed wiring board, the apparatus including a storing device in which the supporting member is stored, a holding head which holds the supporting member, a moving device which moves the holding head relative to each of the supporting table and the storing device, and a control device which controls, according to prescribed control information, the moving device so that the holding head takes the supporting member from a storing position in the storing device and sets the supporting member at a setting position on the supporting surface of the supporting table, and takes the supporting member from the setting position and stores the supporting member at the storing position.

27 Claims, 19 Drawing Sheets

FIG. 17

| PIN NUMBER np | PIN-SETTING INFORMATION |
|---|---|
| 1 | HOLDING PIN $(X1, Y1, \theta 1)$ |
| 2 | SUPPORTING PIN $(X2, Y2, \theta 2)$ |
| 3 | SUPPORTING PIN $(X3, Y3, \theta 3)$ |
| ⋮ | ⋮ |
| np−1 | SUPPORTING PIN $(Xnp-1, Ynp-1, \theta np-1)$ |
| np | HOLDING PIN $(Xnp, Ynp, \theta np)$ |

APPARATUS FOR RESETTING PRINTED-WIRING-BOARD SUPPORTING DEVICE, AND PRINTED-WIRING-BOARD-RELATING-OPERATION PERFORMING SYSTEM

BACKGROUND OF THE INVENTION

1. Field of the Invention

The present invention relates to an apparatus for resetting a printed-wiring-board (PWB) supporting device, and a PWB-relating-operation performing system which can reset a PWB supporting device, and particularly relates to the art of automatizing a resetting operation.

2. Discussion of Related Art

There is known a PWB supporting device which supports a back surface of a PWB and which is used to support a PWB in, e.g., an electric-component mounting device, an electric-circuit inspecting device, a screen printing machine, or an adhesive applying device. A PWB on which electric components (EC; e.g., electronic components) have been mounted should be called as a printed circuit board (PCB) but, in the present specification, a PCB is also referred to as a PWB, for avoiding complexity.

Japanese Patent Document No. 11-195899 and its corresponding U.S. Pat. No. 6,212,751 disclose a PWB supporting device which includes a supporting table; and a plurality of supporting pins each of which can be set on the supporting table. The disclosed PWB supporting device additionally includes a storing device which stores the plurality of supporting pins; a pin holder which can hold each of the supporting pins; and an X-Y robot which is moved, according to pin-position data representing prescribed pin positions on the supporting table, the pin holder between the storing device and the supporting table to take each supporting pin out of the storing device and set the supporting pin at the prescribed position on the supporting table. Thus, this PWB supporting device automatically sets itself, i.e., automatically sets the supporting pins at the respective prescribed positions on the supporting table.

SUMMARY OF THE INVENTION

The present invention provides a PWB-supporting-device resetting apparatus and a PWB-relating-operation performing system that have each feature described below. The following features are described, like claims, in respective paragraphs that are given respective sequential numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided an apparatus for automatically resetting a printed-wiring-board supporting device including a supporting table and at least one supporting member which is set on a supporting surface of the supporting table to support a back surface of a printed wiring board, the apparatus comprising a storing device in which the at least one supporting member is stored; a holding head which holds the supporting member; a moving device which moves at least one of the holding head, the supporting table, and the storing device, relative to at least one other of the holding head, the supporting table, and the storing device; and a control device which controls, according to prescribed control information, the moving device so that the holding head takes the supporting member from a storing position in the storing device and sets the supporting member at a setting position on the supporting surface of the supporting table, and takes the supporting member from the setting position and stores the supporting member at the storing position.

The moving device may be one which moves at least one of (a) the holding head and (b) each of the supporting table and the storing device, relative to the other of the holding head and the each of the supporting table and the storing device. However, the moving device may be one which moves the supporting table relative to the holding head, and the storing device may be one which stores the supporting member and supplies the same to the holding head. The storing device may be one which includes a housing in which the supporting member is accommodated and stored, or one which includes a supporting board on which the supporting member is placed and stored.

The present apparatus automatically sets the supporting member stored in the storing device, onto the supporting table, and automatically stores the supporting member set on the supporting table, into the storing device.

(2) According to a second feature of the present invention that includes the first feature (1), the supporting member comprises a supporting pin having a seating surface which is supported by the supporting surface of the supporting table, and including a shank portion which extends perpendicularly to the seating surface and which supports, at a free end portion thereof, the printed wiring board, and the holding head comprises a pin holder which holds the supporting pin.

The supporting pin may be a suction-type supporting pin or a holding pin which includes, at the free end of the shank portion that supports the printed wiring board (PWB), a suction cup that applies suction to the PWB and thereby holds the PWB. Alternatively, the supporting pin may be a non-suction-type supporting pin which does not include a suction cup and supports the PWB at only the free end of the shank portion.

(3) According to a third feature of the present invention that includes the first or second feature (1) or (2), the control device comprises a control-information memory in which the control information is stored, and further comprises a computer including an information processor which process the control information stored in the control-information memory.

(4) According to a fourth feature of the present invention that includes the third feature (3), the computer further comprises a first starting means for starting, in response to a start command supplied from a host computer, the information processor to process the control information.

The present apparatus automatically starts a resetting operation.

(5) According to a fifth feature of the present invention that includes the third or fourth feature (3) or (4), the control device further comprises an input device which is operable by an operator, and the computer further comprises a second starting means for starting, in response to a start command input through the input device, the information processor to process the control information.

(6) According to a sixth feature of the present invention that includes any one of the third to fifth features (3) to (5), the computer further comprises a first storing means for storing, in the control-information memory, the control information supplied from a host computer.

(7) According to a seventh feature of the present invention that includes any one of the third to sixth features (3) to (6), the control device further comprises a reading device which reads the control information recorded on a portable information-recording medium, and the computer further comprises a second storing means for storing, in the control-information memory, the control information read by the reading device.

The portable information-recording medium may be an optical disk, a magnetic disk, or a magnetic tape.

(8) According to an eighth feature of the present invention that includes any one of the third to seventh features (3) to (7), the control device further comprises an input device which is operable by an operator, and the computer further comprises a third storing means for storing, in the control-information memory, the control information input through the input device.

(9) According to a ninth feature of the present invention that includes any one of the third to eighth features (3) to (8), the control-information memory comprises an internal memory which is incorporated by the computer, and an external memory which is provided outside the computer, and the computer further comprises an information transferring means for transferring the control information from one of the internal memory and the external memory to the other of the internal and external memories.

According to this feature, the computer may be one which controls an operation performing system including the present resetting apparatus. In this case, not only a program and data needed to perform resetting but also a program and data needed to perform an operation may be stored in the control-information memory, in such a manner that those programs and data are usually stored in the external memory and, when resetting or an operation is performed, only necessary program and data are transferred from the external memory to the internal memory. In the last case, the internal memory may be one which has a reduced memory capacity, so that only a reduced amount of data is stored in the internal memory and is processed at an increased rate by the computer.

(10) According to a tenth feature of the present invention that includes any one of the first to ninth features (1) to (9), the control information comprises information relating to at least one of the setting position, the storing position, a sort of the supporting member, a shape of the supporting member, and a dimension of the supporting member.

(11) According to an eleventh feature of the present invention that includes any one of the first to tenth features (1) to (10), the resetting apparatus further comprises a recognizing device which recognizes a free end portion of the supporting member and obtains information relating to the free end portion.

The recognizing device may be one which includes an image taking device, one which emits a light toward the free end portion of the supporting member and recognizes the free end portion based on the light reflected therefrom, or one which includes a radar.

(12) According to a twelfth feature of the present invention that includes the eleventh feature (11), the recognizing device comprises an image taking device which takes an image of the free end portion of the supporting member.

(13) According to a thirteenth feature of the present invention that includes the eleventh or twelfth feature (11) or (12), the moving device moves the recognizing device together with the holding head, relative to the supporting table.

(14) According to a fourteenth feature of the present invention that includes the thirteenth feature (13), the control device comprises a free-end-portion-relating-information-dependent control portion which controls the apparatus, based on the information, obtained by the recognizing device, relating to the free end portion of the supporting member.

The information relating to the free end portion of the supporting member may be position information representing a position of the free end portion, as recited in the seventeenth feature (17); shape information representing a shape of the free end portion; or dimension information representing a dimension of the free end portion. In the case where the shape or dimension information is obtained, the obtained shape or dimension information may be compared with nominal shape or dimension data, so that a sort of the supporting member held by the holding head may be identified, presence or absence of the supporting member may be identified, or any defect of the supporting member may be inspected. Based on this comparison result, the free-end-portion-relating-information-dependent control portion may control the present resetting apparatus to interrupt the current resetting operation, if the supporting member is absent from a correct position, if there is no supporting member, or if the supporting member has a defect. Thus, an erroneous or defective supporting member is prevented from being set on the supporting table, or a supporting member is prevented from being not set on the supporting table.

(15) According to a fifteenth feature of the present invention that includes the fourteenth feature (14), the resetting apparatus further comprises an informing device which outputs information recognizable by an operator, and the free-end-portion-relating-information-dependent control portion comprises an informing control portion which operates the informing device when the information obtained by the recognizing device differs from a reference information by not less than a prescribed amount.

(16) According to a sixteenth feature of the present invention that includes the fourteenth or fifteenth feature (14) or (15), the free-end-portion-relating-information-dependent control portion comprises a moving control portion which controls the moving device.

(17) According to a seventeenth feature of the present invention that includes the sixteenth feature (16), the information obtained by the recognizing device comprises position information representing a position of the free end portion of the supporting member, and the free-end-portion-relating-information-dependent control portion comprises a stop-position correcting portion which corrects a stop position where the moving device stops a movement of at least one of (a) the holding head and (b) at least one of the supporting table and the storing device, relative to the other of (a) the holding head and (b) the at least one of the supporting table and the storing device.

According to this feature, the holding head is accurately positioned relative to at least one of the supporting member set on the supporting table and the supporting member stored in the storing device, so that the holding head can accurately hold the supporting member.

(18) According to an eighteenth feature of the present invention that includes any one of the fourteenth to seventeenth features (14) to (17), the resetting apparatus further comprises a rotating device which rotates the holding head about an axis line thereof, the free-end-portion-relating-information-dependent control portion comprises a rotating control portion which controls the rotating device, the information obtained by the recognizing device comprises rotation-position information representing a rotation position of the supporting member as an angular phase thereof about an axis line thereof, and the rotating control portion comprises a rotation-position correcting portion which corrects, based on the rotation-position information, at least one of a rotation position of the holding head as an angular phase thereof about the axis line thereof and the rotation position of the supporting member held by the holding head.

According to this feature, when the holding head holds the supporting member set on the supporting table, the holding head can be rotated to a prescribed rotation position relative to the supporting member or, when the supporting member held by the holding head is set on the supporting table, the supporting member can be rotated to a prescribed rotation position at which the supporting member is to be set on the table.

(19) According to a nineteenth feature of the present invention, there is provided a system for performing an operation relating a printed wiring board, comprising a printed-wiring-board supporting device comprising a supporting table and at least one supporting member which is set on a supporting surface of the supporting table to support a back surface of the printed wiring board; an operation performing head which performs an operation for the printed wiring board supported by the printed-wiring-board supporting device; a storing device in which the at least one supporting member is stored; a holding head which holds the supporting member; a first moving device which moves at least one of the holding head, the supporting table, and the storing device, relative to at least one other of the holding head, the supporting table, and the storing device; and a control device which controls, according to prescribed control information, the first moving device so that the holding head takes the supporting member from a storing position in the storing device and sets the supporting member at a setting position on the supporting surface of the supporting table, and takes the supporting member from the setting position and stores the supporting member at the storing position.

The operation performing head may be an electric-component mounting head which mounts an electric component on a surface of the PWB; a screen-printing head which screen-prints a creamed solder on a surface of the PWB; an applying head which sequentially applies a highly viscous fluid, such as an adhesive, to a single spot, or a plurality of spots, on a surface of the PWB; or a circuit inspecting head which inspects an electric circuit formed on a surface of the PWB. Depending upon the sort of the operation performing head employed, the operation performing system provides an electric-component mounting system, a screen-printing system, a highly-viscous-fluid applying system, or an electric-circuit inspecting system.

(20) According to a twentieth feature of the present invention that includes the nineteenth feature (19), the operation performing system further comprises a second moving device which moves at least one of the operation performing head and the printed-wiring-board supporting device, relative to the other of the operation performing head and the printed-wiring-board supporting device, so that the operation performing head performs the operation for the printed wiring board supported by the printed-wiring-board supporting device, and the control device comprises a first control portion which controls the first moving device, and a second control portion which controls the second moving device.

(21) According to a twenty-first feature of the present invention that includes the twentieth feature (20), the operation performing system further comprises a movable member which carries both the holding head and the operation performing head, and the second moving device shares at least a portion thereof with the first moving device.

The movable member may be a member which is moved by a movable-member moving device in at least a direction having two components perpendicular to each other on a plane parallel to a surface of the PWB on which the operation is to be performed and also parallel to the supporting surface of the supporting table, so that the operation performing head performs the operation; a member which is moved in one of the two directions perpendicular to each other on the plane; or a rotatable member which is rotated about an axis line. In the case where the movable member is provided by the rotatable member, the rotatable member may be an intermittently rotatable member which is intermittently rotated in one direction by an intermittently rotating device; or a rotatable member which is rotated by an arbitrary angle in only a forward direction, or in each of forward and backward directions, by a rotating device.

A portion of the first moving device that moves at least one of the holding head, the supporting table, and the storing device in a direction parallel to the supporting surface of the supporting table is common to a portion of the second moving device that moves at least one of the operation performing head and the PWB supporting device in the direction parallel to the supporting surface of the supporting table.

According to this feature, the present operation performing system can be produced with ease and at low cost.

(22) According to a twenty-second feature of the present invention that includes any one of the nineteenth to twenty-first features (19) to (21), the operation performing system further comprises a supporting-member recognizing device which recognizes a free end portion of the supporting member positioned at at least one of the setting position and the storing position.

The supporting-member recognizing device may be one which includes an image taking device which takes an image of the free end portion of the supporting member.

(23) According to a twenty-third feature of the present invention that includes any one of the nineteenth to twenty-second features (19) to (22), the operation performing system further comprises a mark recognizing device which recognizes at least one fiducial mark provided on the printed wiring board supported by the printed-wiring-board supporting device.

(24) According to a twenty-fourth feature of the present invention that includes the twenty-third feature (23), the operation performing system further comprises a supporting-member recognizing device which recognizes a free end portion of the supporting member positioned at at least one of the setting position and the storing position, and the supporting-member recognizing device is provided by the mark recognizing device.

(25) According to a twenty-fifth feature of the present invention that includes any one of the nineteenth to twenty-fourth features (19) to (24), the operation performing system further comprises an electric-component supplying device which supplies at least one electric component, and the operation performing head comprises an electric-component mounting head which receives the electric component from the electric-component supplying device and mounts the component on the printed wiring board supported by the printed-wiring-board supporting device.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which:

FIG. 17 is a view for explaining pin-setting information used to set holding pins and supporting pins on the holding table;

DETAILED DESCRIPTION OF PREFERRED EMBODIMENTS

Hereinafter, there will be described in detail an embodiment of the present invention as applied to a resetting apparatus which resets a printed-wiring-board (PWB) holding device employed in an electric-component (EC) mounting system, and to the EC mounting system, by reference to the drawings.

Figure 1:
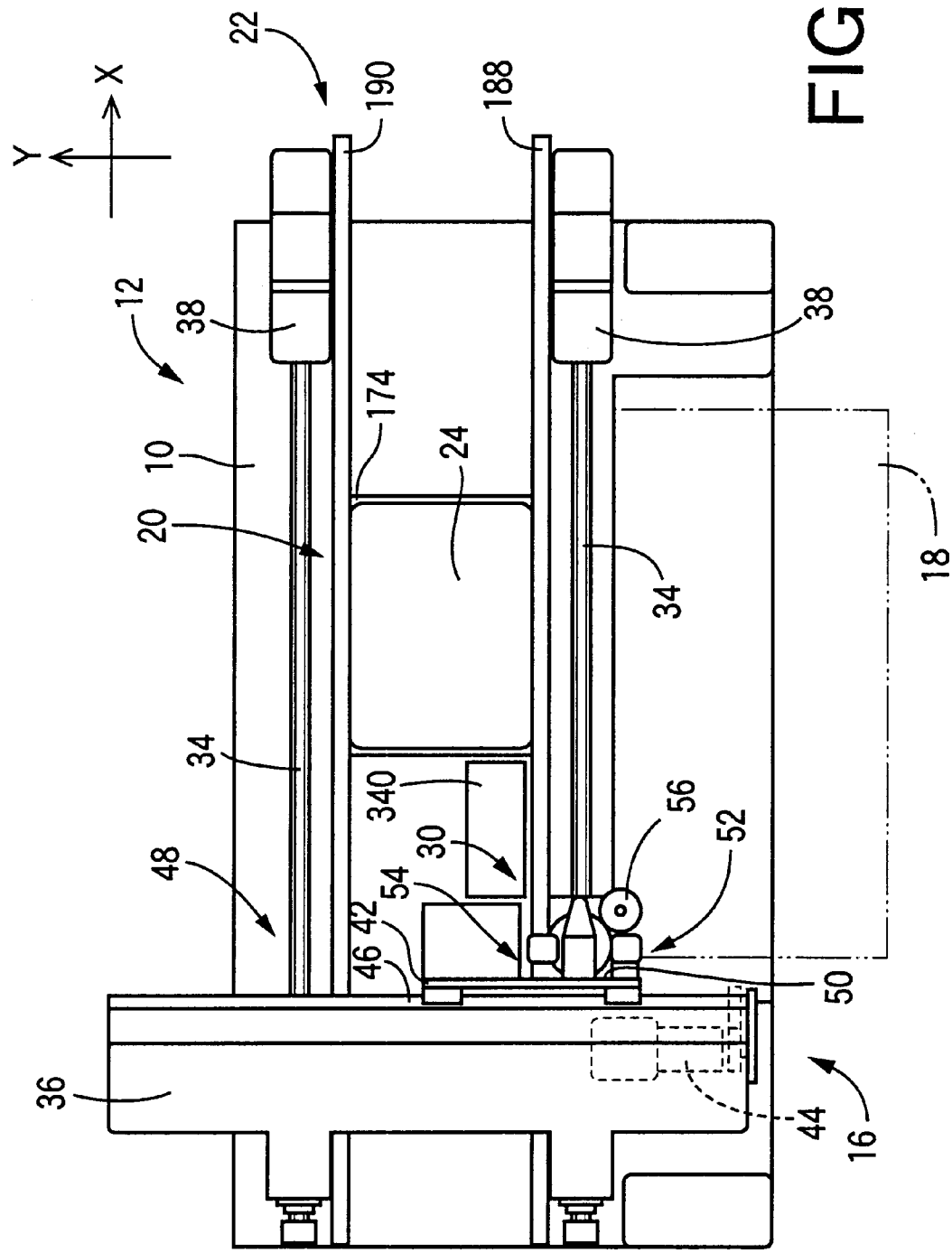
FIG. 1 is a schematic plan view of an electric-component (EC) mounting system including a resetting apparatus which resets a printed-wiring-board (PWB) holding device and to which the present invention is applied.

In FIG. 1, reference numeral 10 designates a base as a main frame of an EC mounting system 12 as a PWB-relating-operation performing system. On the base 10, there are provided an EC mounting device 16 as an operation performing device, an EC supplying device 18, and a PWB supporting and conveying device 20. The PWB supporting and conveying device 20 includes a PWB conveyor 22 which extends in an X-axis direction (i.e., a left-right direction in FIG. 1) and which conveys a PWB 24 in the X-axis direction, and positions and supports the PWB 24 at a prescribed EC-mount position where the PWB 24 is stopped by a stopper as a stopping device, not shown. The PWB supporting and conveying device 20 will be described in more detail later. The EC supplying device 18 is provided on one side of the PWB conveyor 22. Since, however, the EC supplying device 18 is not relevant to the present invention, no description thereof is made here.

The EC mounting device 16 has a construction similar to an EC mounting device disclosed in Japanese Patent No. 2,824,378, and accordingly it is briefly described here.

The EC mounting device 16 includes an EC mounting head 30 as an operation performing head that is linearly movable in each of the X-axis direction and a Y-axis direction perpendicular to the X-axis direction to convey an EC 32, in particular, an electronic component, and mount the same. To this end, on the base 10, there are provided, on both sides of the PWB conveyor 22 in the Y-axis direction, two ball screws 34 which extend parallel to the X-axis direction and which are threadedly engaged with two nuts, not shown, fixed to an X-axis table 36. When the ball screws 34 are rotated by respective X-axis-table drive motors 38, the X-axis table 36 is moved in the X-axis direction. On the bed 10, there are provided two guide rails as guide members, not shown, below the two ball screws 34, and the movement of the X-axis table 36 is guided by the two guide rails and two guide blocks as guided members, not shown, fixed to the table 36 such that the two guide blocks slide on the two guide rails, respectively.

The X-axis table 36 supports a ball screw 40 (FIG. 2) which extends parallel to the Y-axis direction and which is threadedly engaged with a nut, not show, fixed to a Y-axis table 42. When the ball screw 40 is rotated by a Y-axis-table drive motor 44 (FIG. 1), the Y-axis table 42 is moved while being guided by two guide rails 46 as guide members. Thus, the nuts, the ball screws 34, the X-axis table 36, and the X-axis-table drive motors 38, and, the nut, the ball screw 40, the Y-axis table 42, and the Y-axis-table drive motor 44 cooperate with each another to provide an X-Y robot 48 which moves the EC mounting head 30 in directions parallel to a surface of the PWB 24. The PWB 24 is horizontally conveyed, positioned, and supported, and the EC mounting head 30 is moved by the X-Y robot 48 to an arbitrary position on a horizontal plane.

Figure 2:
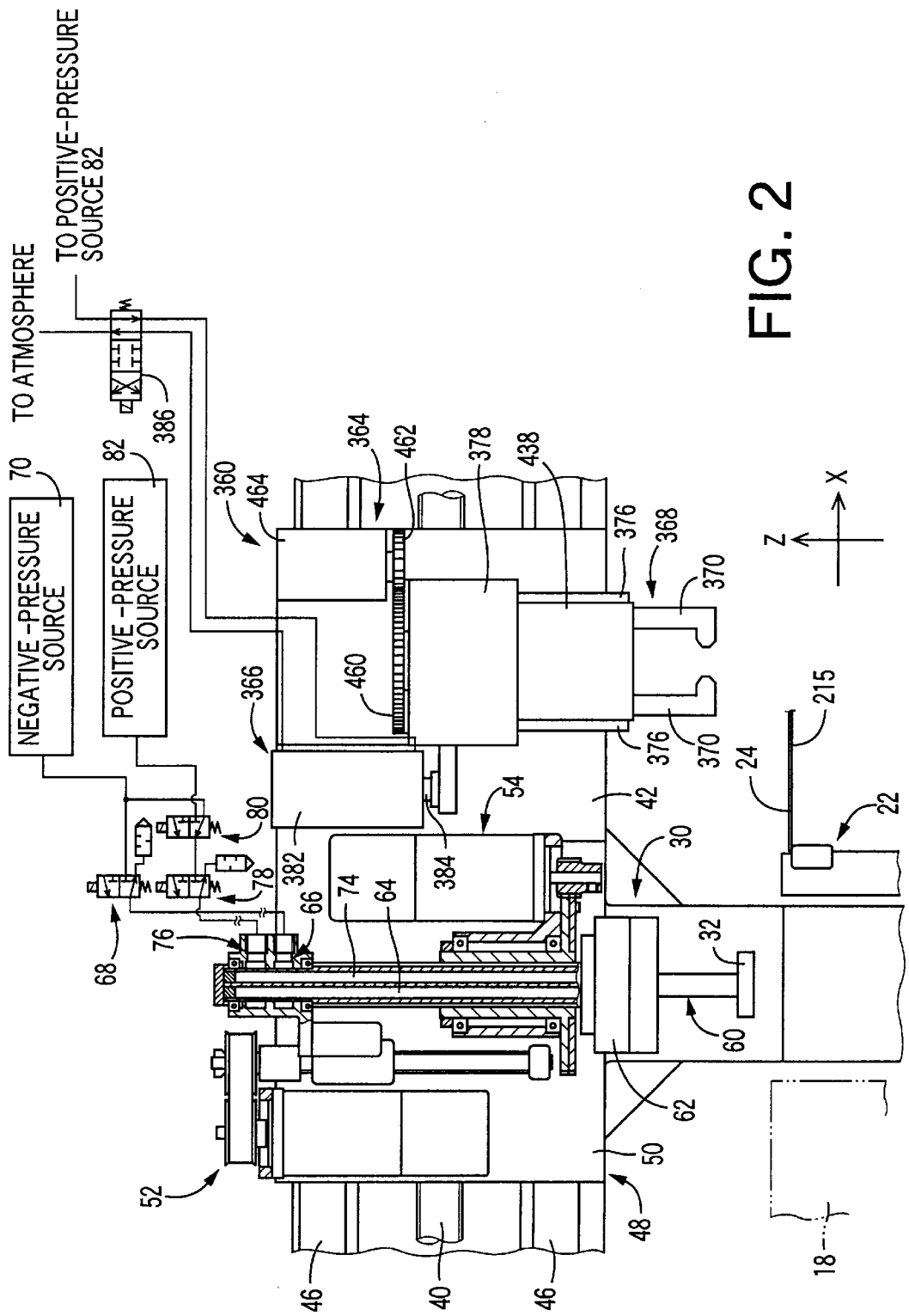
FIG. 2 is a side elevation view of an EC mounting device of the EC mounting system that includes an EC mounting head, a holding unit, and a Y-axis table supporting the EC mounting head and the holding unit.

On the X-axis table 36, there is provided a CCD (charge-coupled device) camera as an image taking device, below the Y-axis table 42, at a position between the EC supplying device 18 and the PWB supporting and conveying device 20 in the Y-axis direction. The CCD camera takes an image of the EC 32 held by the EC mounting head 30. Since, however, this CCD camera is not relevant to the present invention, no description thereof is made here. As shown in FIG. 2, the EC mounting head 30 is attached to a vertical side surface 50 of the Y-axis table 42, such that the head 30 is movable upward and downward and is rotatable. The side surface 50 supports an elevating and lowering device 52 which elevates and lowers the head 30; a rotating device 54 which rotates the head 30 about its centerline; and a CCD camera 56 as an image taking device that takes an image of each of a plurality of fiducial marks provided on the PWB 24. The CCD camera 56 is not shown in FIG. 2. In the present embodiment, the Y-axis table 42 supports a lighting device, not shown, which lights an object when the CCD camera 56 takes an image of the object.

As shown in FIG. 2, the EC mounting head 30 includes a suction nozzle 60 as a sort of component holder that sucks and holds the EC 32, and a nozzle holder 62 which holds the suction nozzle 60 such that the nozzle 60 is detachable from the holder 62. The nozzle holder 62 is moved by the X-Y table 48 to an arbitrary position on the horizontal plane. In the present embodiment, the nozzle holder 62 applies a suction or a negative pressure to the suction nozzle 60 and thereby holds the nozzle 60. To this end, the nozzle holder 62 is connected to a negative-pressure supply source 70 and the atmosphere via an air passage 64, a rotary valve 66, and a solenoid-operated direction-switch valve 68 and, when the direction-switch valve 68 is switched, the holder 62 is selectively communicated with the supply source 70 or the atmosphere, so that the holder 62 holds or releases the nozzle 60. In addition, the suction nozzle 60 is connected to the negative-pressure supply source 70, a positive-pressure supply source 82, and the atmosphere via an air passage 74, a rotary valve 76, and two solenoid-operated direction-switch valves 78, 80 and, when the direction-switch valves 68 are switched, the nozzle 60 is selectively communicated with the negative-pressure supply source 70, the positive-pressure supply source 82, or the atmosphere. The suction nozzle 62 applies a negative air pressure to the EC 32 and thereby holds it, and applies a positive air pressure to the EC 32 and thereby releases it. The negative-pressure supply source 70 may be a negative-pressure supplying device or an air sucking device, and the positive-pressure supply source 82 may be an air supplying device which supplies an air having a positive pressure. In the present embodiment, the direction-switch valves 68, 78, 80 are provided on the Y-axis table 42, and the valves 68, 80 are connected to the negative-pressure supply source 70 and the positive-pressure supply source 82 via respective connectors, not shown, provided on the Y-axis table 42.

Figure 3:
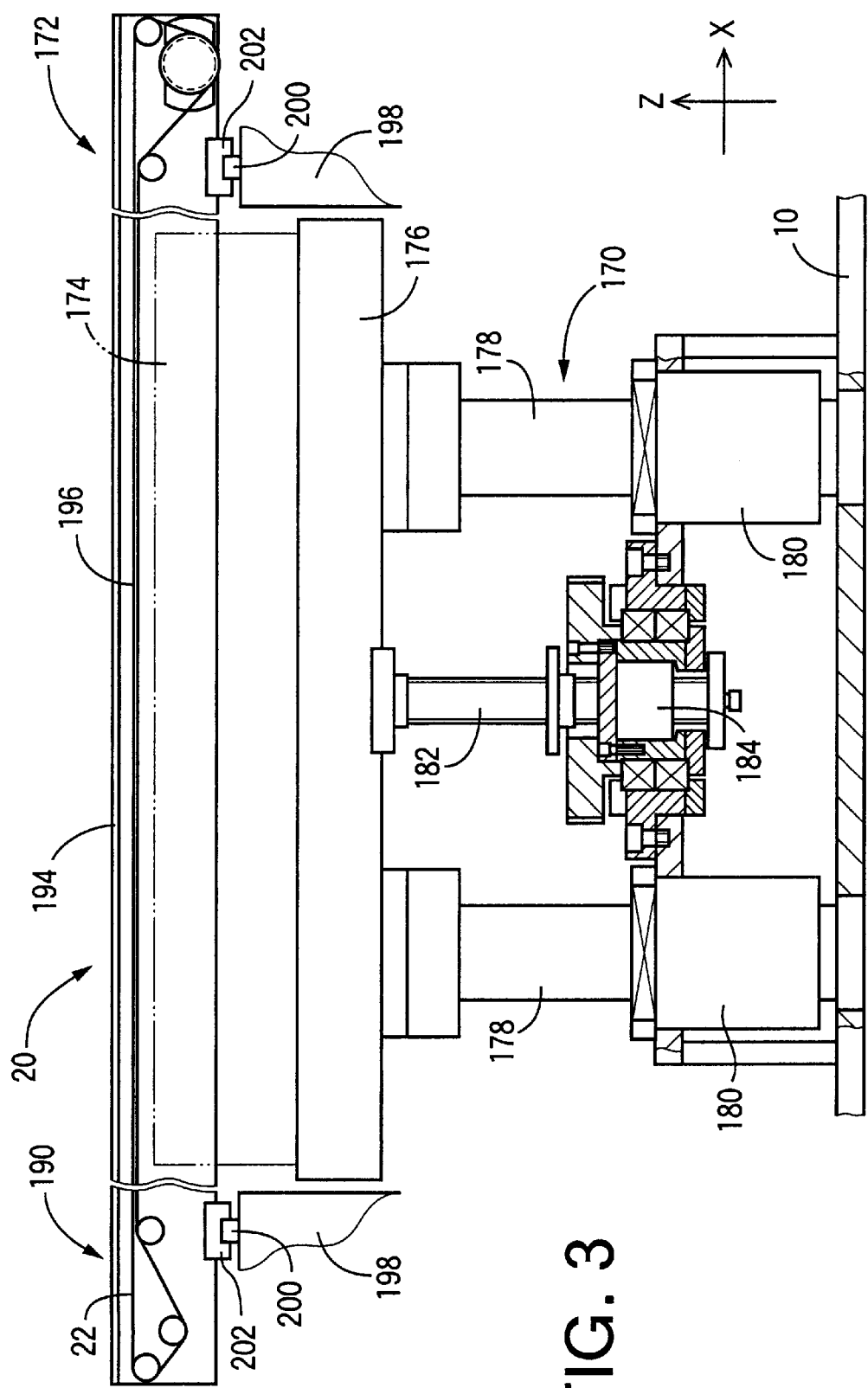
FIG. 3 is a partly cross-sectioned, front elevation view of a PWB supporting and conveying device including the PWB holding device.

As shown in FIG. 3, the PWB supporting and conveying device 20 includes a PWB elevating and lowering device 170, a PWB clamping device 172, and a PWB holding device 174. The PWB elevating and lowering device 170 includes a PWB lifter 176. Two guide rods 178 extend downward from a lower surface of the PWB lifter 176, and fit in two guide sleeves 180, respectively, fixed to the base 10, such that the lifter 176 is movable upward and downward. A ball screw 182 is fixed to the lower surface of the lifter 176, and is threadedly engaged with a nut 184 which is attached to the base 10 such that the nut 184 is rotatable about a vertical axis line and is not movable in an axial direction thereof. When the nut 184 is rotated by an elevating and lowering motor 186 (FIG. 12), the ball screw 182 is moved upward and downward, so that the PWB lifter 176 is moved upward and downward.

As shown in FIG. 1, the PWB clamping device 172 includes a fixed guide 188 and a movable guide 190 which extend parallel to a PWB-convey direction (i.e., the X-axis direction). Two conveyor belts 196 of the PWB conveyor 22 are supported by respective surfaces of the fixed and movable guides 188, 190 that are opposed to each other, and cooperate with each other to convey the PWB 24. As shown in FIG. 3, an upper end portion of the movable guide 190 provides a PWB hold-down portion 194 which somewhat projects inward toward another PWB hold-down portion 194 which is provided by an upper end portion of the fixed guide 188. Those PWB hold-down portions 194 are slightly spaced from an upper surface of the PWB 24 placed on the conveyor belts 196 as conveyor members of the PWB conveyor 22.

The opposed surfaces of the fixed and movable guides 188, 190 support respective clamping plates as movable clamping members that cooperate with the PWB hold-down portions 194 to clamp the PWB 24. The two clamping plates have an elongate shape parallel to a lengthwise direction of the fixed and movable guides 188, 190, and are normally biased by respective springs as biasing devices such that the clamping plates are held at an unclamping position where the clamping plates are spaced from the PWB hold-down portions 194 and are positioned below the conveyor belts 196. When the PWB 24 is clamped, a plurality of clamping cylinders as drive devices move the clamping plates toward the PWB hold-down portions 194 so that the clamping plates cooperate with the hold-down portions 194 to clamp opposite end portions of the PWB 24. In the present embodiment, the PWB hold-down portions 194, the clamping plates, the springs, and the clamping cylinders cooperate with one another to provide the PWB clamping device 172.

The base 10 supports the movable guide 190 such that the movable guide 190 is movable in a direction perpendicular to the PWB-convey direction, i.e., in the Y-axis direction. As shown in FIG. 3, two guide rails 200 as guide members that extend in the direction perpendicular to the PWB-convey direction on the horizontal plane are provided on respective upper-end surfaces of two support blocks 198 fixed to the base 10. Two guide blocks 202 as guided members that are fixed to a lower surface of the movable guide 190 fit on the two guide rails 200, such that the movable guide 190 is movable on the rails 200. The movable guide 190 is moved by a moving device including a feed screw and a nut, not shown, and a PWB-convey-width changing motor 204 (FIG. 16) as a drive source, so that the movable guide 190 is moved toward, and away from, the fixed guide 188 and a PWB-convey width corresponding to a width of the PWB 24 conveyed by the PWB conveyor 22 is automatically changed. The moving device and the guide rails 200 cooperate with each other to provide a PWB-convey-width changing device.

Figure 4:
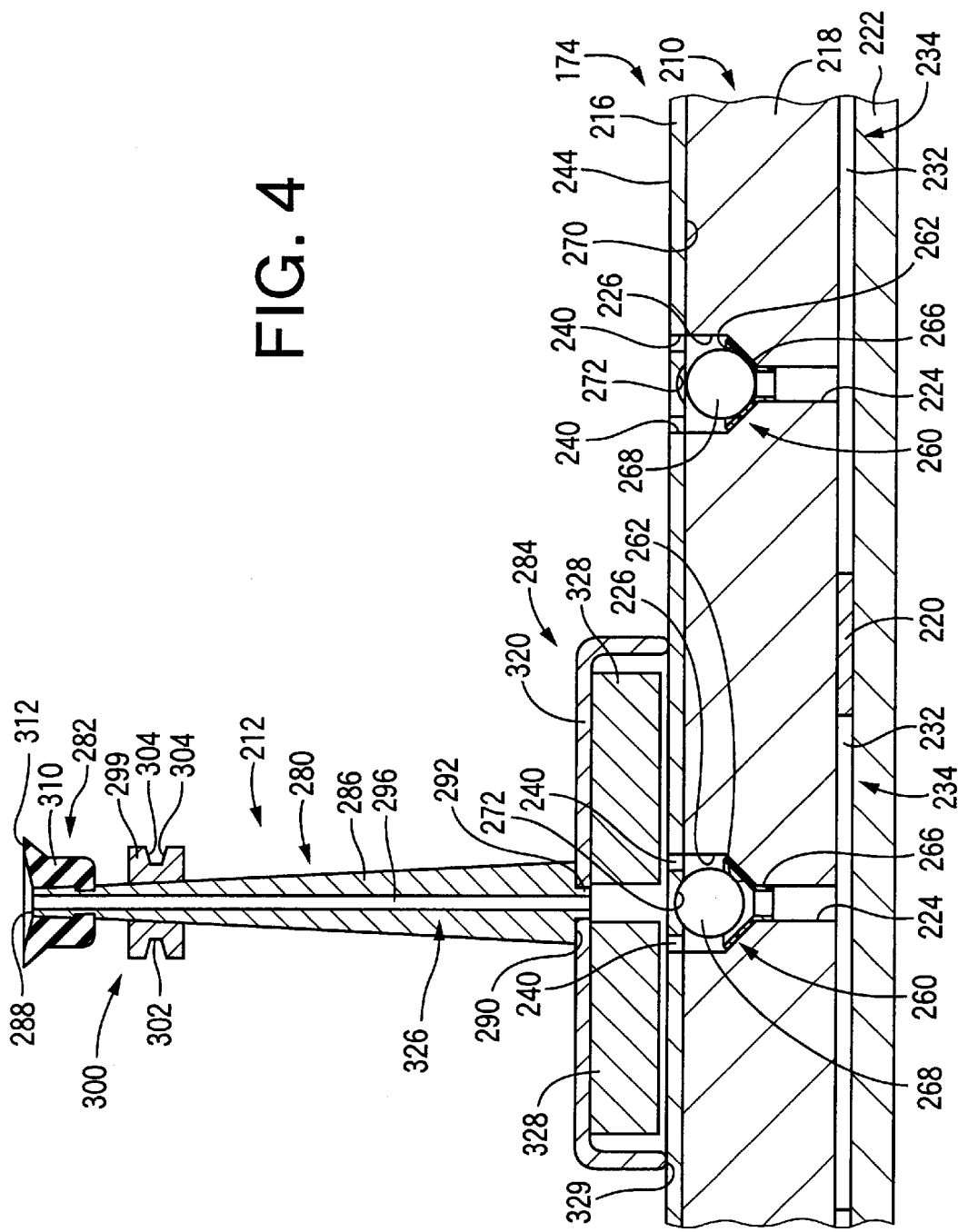
FIG. 4 is a cross-sectioned, front elevation view of the PWB holding device including a holding table and a holding pin attachable to one of a plurality of negative-pressure-supply holes of the holding table.

The PWB holding device 174 is provided on the PWB lifter 176, and is elevated and lowered by the PWB elevating and lowering device 170. As shown in FIG. 4, the PWB holding device 174 includes a holding table 210, a plurality of holding pins 212 each as a sort of supporting pin as a supporting member that are attachable to the holding table 210, and a plurality of supporting pins 214 (FIG. 13) each as a supporting member that are attachable to the holding table 210. Thus, the PWB holding device 174 is a sort of PWB supporting device, and the holding table 210 is a sort of supporting table.

Figure 6:
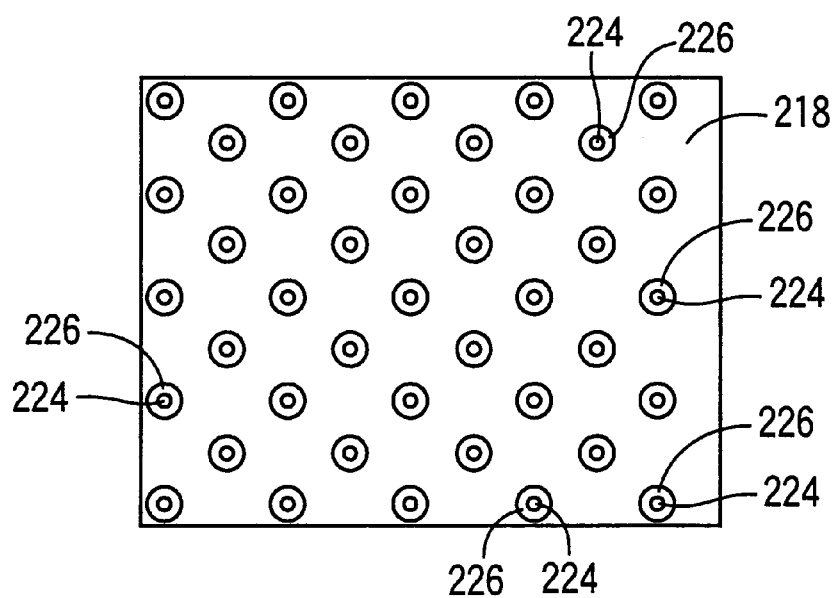
FIG. 6 is a plan view of a base as part of the holding table of the PWB holding device.

The holding table 210 includes a coming-off preventing plate 216, a base 218, a spacer 220, and a cover 222 which are superposed on one another. The base 218 as a main member of the holding table 210 has a plate-like shape, and is formed of a non-magnetic material such as aluminum. The base 218 has a plurality of negative-pressure supply holes 224 which are formed through the thickness thereof and open in each of the upper and lower surfaces thereof. Each supply hole 224 is a stepped hole including a small-diameter portion on the side of the spacer 220 and a large-diameter portion on the side of the coming-off preventing plate 216. The large-diameter portion of each supply hole 224 provides a valve hole 226. The supply holes 224 are arranged as shown in FIG. 6.

The spacer 220 has a thin-plate-like shape having a plurality of openings 232 which are formed through the thickness thereof in respective portions thereof corresponding to the respective negative-pressure supply holes 224 of the base 218. The cover 222 also has a plate-like shape and cooperates with the base 218 to sandwich the spacer 220, so that opposite ends of each of the openings 232 of the spacer 220 are closed to provide a communication passage 234.

The cover 222 has a plurality of communication holes (not shown) which are formed through the thickness thereof and communicate with the respective communication passages 234 of the spacer 220. The holding table 210 is fixed to the PWB lifter 176 by a fixing device, not shown, and, in this state, the communication holes of the cover 222 are connected to respective passages, not shown, formed in the lifter 176, and are eventually connected to the negative-pressure supply source 70 via those passages. Between those passages and the supply source 70, there is provided a switch-valve device, not shown, which is switchable to selectively communicate the supply holes 224 with the supply source 70 or the atmosphere.

In the present embodiment, the coming-off preventing plate 216 is formed of a ferromagnetic material such as steel, has a thin-plate-like shape, and is superposed on the upper surface of the base 218. In the present embodiment, the preventing plate 216 has substantially the same size as that of the base 218, and accordingly covers all the valve holes 226 of the base 218. The preventing plate 216, the base 218, the spacer 220, and the cover 222 are fixed to one another in such a manner that respective outer peripheral portions of the elements 216, 218, 220, 222, free of the communication passages 234, are fixed to one another by a fixing device such as bolts, not shown. The thus fixed elements 216, 218, 220, 222 function as the integral holding table 210. In the present embodiment, the holding table 210 has such a size which assures that the holding table 210 can hold a plurality of sorts of PWBs 24 having respective different sizes including the largest size and the smallest size.

Figure 5:
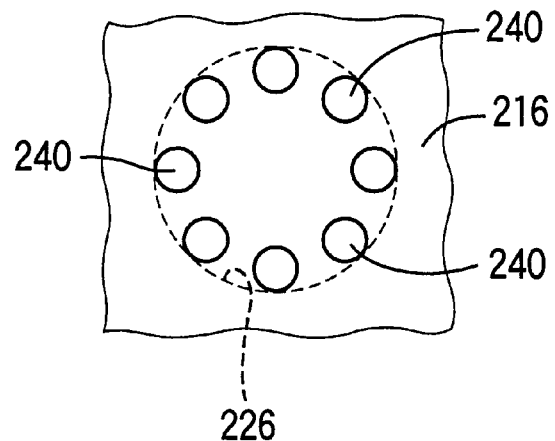
FIG. 5 is a plan view showing a plurality of communication holes which are formed in a coming-off preventing plate of the PWB holding device.

Each of respective portions of the coming-off preventing plate 216 that correspond to the valve holes 226 of the base 218 has a plurality of communication holes 240 at respective positions offset from the centerline of the corresponding valve hole 226. As shown in FIG. 5, those communication holes 240 are located along a circle whose center coincides with the centerline of the valve hole 226, such that the communication holes 240 are equiangularly spaced from each other about the center of the circle. Each communication hole 240 has a circular cross section, and has a diameter smaller than that of the valve hole 226. In the present embodiment, the coming-off preventing plate 216 includes those respective portions which close the valve holes 226 and thereby prevent respective balls 268 of respective open-and-close valves 260, described later, from coming off the valve holes 226. Thus, it can be said that the coming-off preventing plate 216 is obtained by integrally forming a plurality of coming-off preventing portions. In the present embodiment, the upper surface of the coming-off preventing plate 216 provides the upper surface of the holding table 210, and thereby provides a holding surface 244 as a supporting surface. If it can be said that the coming-off preventing plate 216 closes the respective openings of the valve holes 226 in the holding surface 244, it can be said that the negative-pressure-supply holes 224 open in the holding surface 244.

The base 218, the spacer 220, and the cover 222 have a high degree of flatness like those employed in a PWB holding apparatus disclosed in Japanese Patent Document No. 7-15189. Similarly, the coming-off preventing plate 216 has a high degree of flatness, and accordingly the holding surface 244 of the holding table 210 enjoys a high degree of flatness. In the present embodiment, a surface of the PWB lifter 176 to which the PWB holding device 174 is fixed is horizontal, and the holding table 210 is detachably fixed by a fixing device, not shown, to the lifter 176 such that the holding surface 244 of the holding table 210 is horizontal.

As shown in FIG. 4, an open-and-close valve 260 is provided in each of the negative-pressure supply holes 224. A bottom surface of the valve hole 226, located between the large-diameter and small-diameter portions of the each supply hole 224, is tapered such that the diameter of the tapered bottom surface gradually decreases in a direction toward the small-diameter portion, i.e., in a downward direction. The tapered bottom surface provides an upward facing valve seat 262. Each of the valve seats 262 is covered by a pad 266 which is formed of a synthetic resin as a sort of material that is softer than aluminum. A ball 268 as a spherical member as a valve member is provided in each of the valve holes 226. The ball 268 has a diameter smaller than that of the valve hole 226, and is movable in the valve hole 226. In the present embodiment, the ball 268 is formed of a ferromagnetic material such as steel. The coming-off preventing plate 216 has, in respective portions of a lower surface 270 (i.e., a surface on the side of the valve holes 226), respective positioning recesses 272 which correspond to the respective valve holes 226 and each of which is located inside the communication holes 240. Each positioning recess 272 has a part-spherical inner surface corresponding to an outer spherical surface of each ball 268.

Next, the holding pins 212 and the supporting pins 214 will be described.

As shown in FIG. 4, each holding pin 212 includes a pin portion 280 as a shank portion, a cup portion 282, and a seat portion 284, and applies a negative pressure to the PWB 24 to hold and support the same 24. Thus, each holding pin 212 can be said as a suction-type backup pin. Each supporting pin 124 does not include a cup portion 282 or does not have a function of applying a negative pressure to the PWB 24 and thereby holding and supporting the same 24. Each supporting pin 214 supports, at a free end surface of a pin portion thereof, the PWB 214, and can be said as a non-suction-type backup pin.

First, the holding pin 212 will be described.

Figure 12:
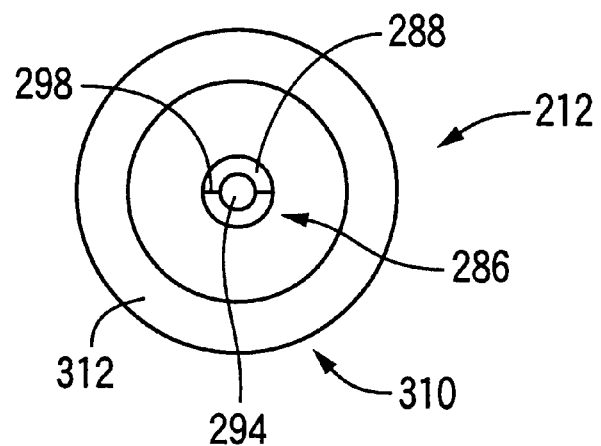
FIG. 12 is a plan view of the holding pin shown in FIG. 4.

A pin 286 functioning as the pin portion 280 of the holding pin 212 has a circular cross section, and is tapered such that its diameter decreases toward its free end (i.e., its upper end). A free or upper end surface of the pin 286 provides a flat support surface 288. The pin 286 has, at the center of a lower surface 290 thereof, a projection 292 having a circular cross section, and additionally has a passage 296 which is formed therethrough in an axial direction thereof and opens in each of the support surface 288 and an end surface of the projection 292. In the present embodiment, as shown in FIG. 12, the opening of the passage 296 in the support surface 288 is used as a fiducial mark 294 to detect a position of the holding pin 212. The support surface 288 has a fiducial line 298 which extends in a diametric direction thereof through a center thereof. In the present embodiment, the fiducial line 298 has a color different from the background color of the support surface 288. For example, if the support surface 288 is white, the fiducial line 298 is black. Accordingly, when an image of the support surface 288 is taken, the fiducial line 298 can be identified from the remaining portion of the support surface 288.

Figure 9:
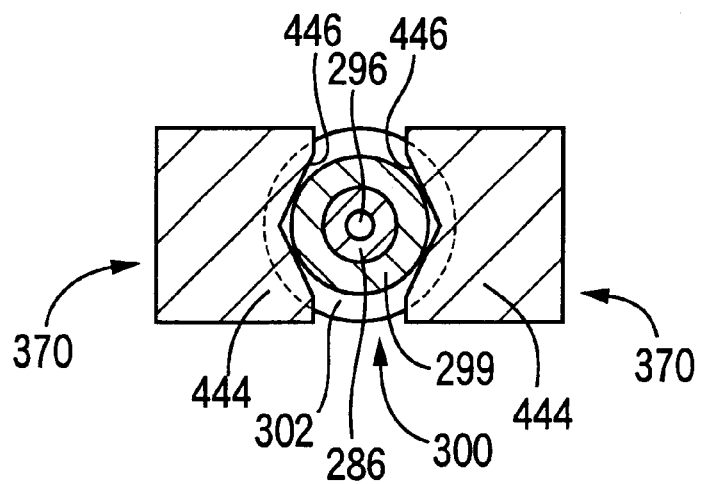
FIG. 9 is a cross-section view taken along 9—9 in FIG. 7.

A neck member 299 as an engageable member is fixed, by an appropriate fixing means or manner, such as brazing, to a portion of the pin 286 that is near to its upper end, and provides a neck portion 300 as an engageable portion. As shown in FIG. 9, the neck portion 300 has a circular transverse cross section, and has a circular groove 302 at an intermediate portion thereof as viewed in the axial direction of the pin 286. As shown in FIG. 4, the circular groove 302 has a trapezoidal cross section taken in the axial direction of the pin 286. A pair of side surfaces 304 defining the groove 302 are inclined such that a distance between the two side surfaces 304 increases in a radially outward direction.

A suction cup 310 fits on an upper end portion of the pin portion 280, such that the suction cup 310 is detachable from the pin portion 280 but is not easily pulled off the same 280. The suction cup 310 provides the cup portion 282. In the present embodiment, the suction cup 310 is formed of rubber, and has a diameter greater than that of the support surface 288. An upper portion of the cup 310 projects upward from the support surface 288, and an upper surface of the cup 310 provides a contact surface 312 which has a flat, annular shape whose diameter is greater than that of the support surface 288, surrounds the support surface 288, and faces upward.

Figure 19:
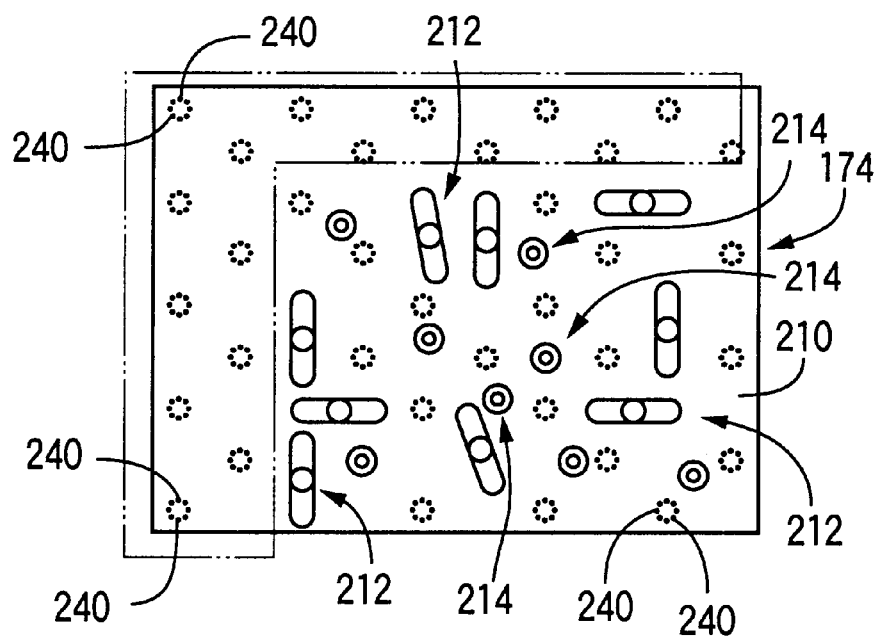
FIG. 19 is a schematic plan view showing a state in which the holding pins and the supporting pins are set on the holding table.

A seat member 320 as an attached member is fixed to a lower end portion of the pin 286 that has the greatest diameter. The seat member 320 provides the seat portion 284. As shown in FIGS. 4 and 19, the seat member 320 has an elongate container-like shape, and a width of an inner space of the seat member 320 is somewhat greater than the diameter of the valve hole 226 and a length of the inner space is not less than two times greater than the width thereof. An end surface of the seat member 320 provides an annular seat surface 329 which extends parallel to the support surface 288 and which closely contacts the holding table 210. The projection 292 of the pin 286 externally fits in a lengthwise middle portion of an upper wall 322 of the seat member 320, such that the pin 286 extends perpendicularly to the seat surface 329, and is fixed to the wall 322 by an appropriate fixing means or manner, such as brazing. The connection recess opens in the seat surface 329 opposite to the wall 322 to which the pin 286 is fixed, and the passage 296 of the pin portion 280 is communicated with the inner space, i.e., connection recess, of the seat member 320. A plurality of permanent magnets 328, e.g., two permanent magnets 328 in the present embodiment, are provided in the inner space of the seat member 320, such that the permanent magnets 328 are fixed to respective portions of the wall 322 on both sides of the passage 296. Thus, the passage 296 is communicated with the middle portion of the inner space of the seat member 320. Each of the permanent magnets 328 has a rectangular parallelepiped shape, and has a thickness somewhat smaller than a depth of the seat member 320, so that the each magnet 328 is located somewhat inward of the seat surface 329. A width of each magnet 328 is somewhat smaller than that of the inner space of the seat member 320, and a small clearance is left between the each magnet 328 and each of opposite side walls of the seat member 320. In the present embodiment, the passage 296, and the small clearances left between the permanent magnets 328 and the side walls of the seat member 320 cooperate with each other to provide a negative-pressure passage 326 which extends from the seat surface 329 of the holding pin 212 to the opposite, support surface 288 thereof, through the entire length thereof.

Next, the supporting pin 124 will be described.

Figure 13:
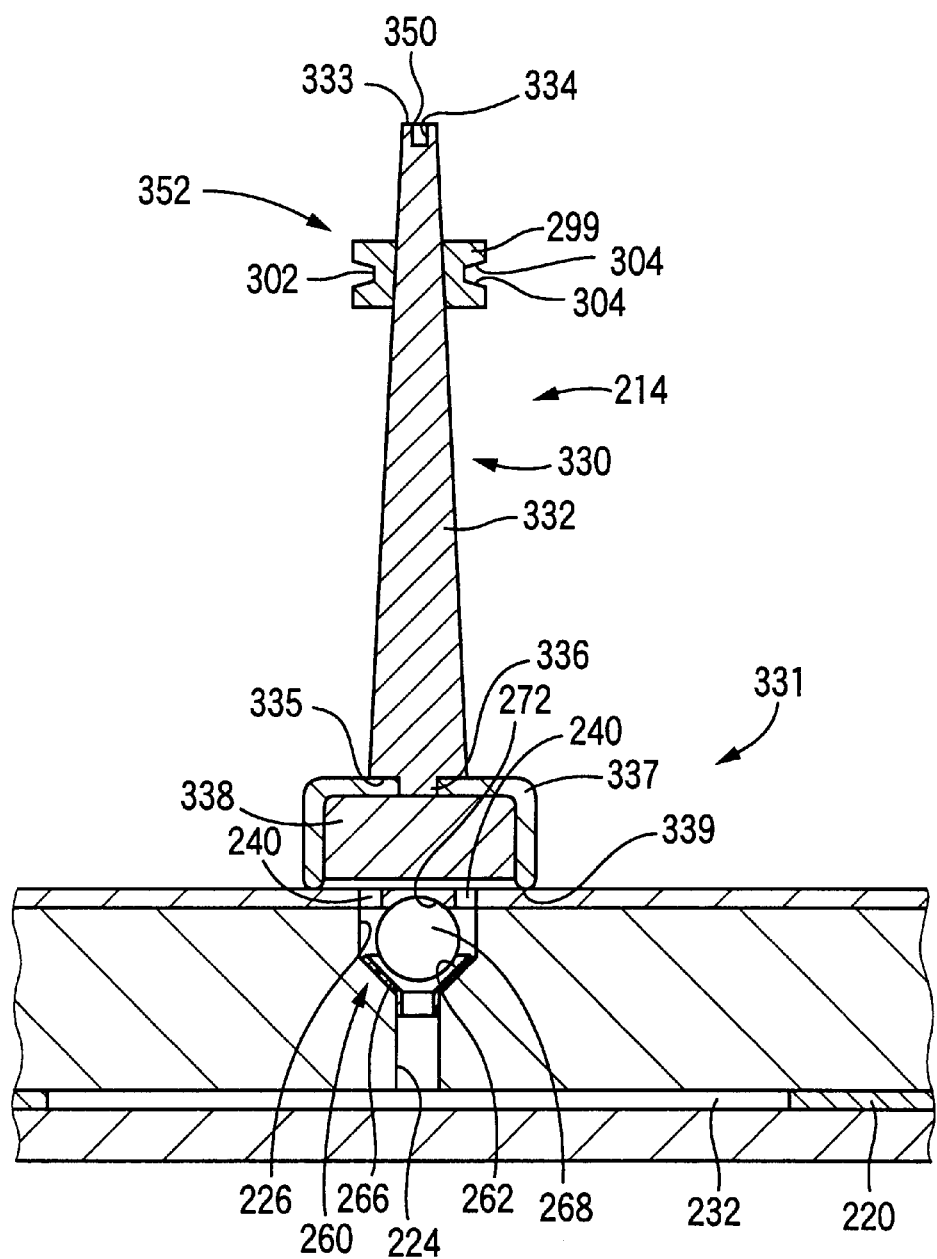
FIG. 13 is a cross-sectioned, front elevation view of a supporting pin as part of the PWB holding device.

As shown in FIG. 13, the supporting pin 214 includes a pin portion 330 as a shank portion, and a seat portion 331. The pin portion 330 is provided by a pin 332 which has a circular cross section and whose diameter decreases in a direction toward a free end surface thereof. The free end surface of the pin 332 provides a support surface 333. The pin 332 has a recess 334 which opens in the support surface 333 and which provides a fiducial mark 350. The pin 332 has a projection 336 which projects from a lower surface 335 thereof and which is fitted in, and fixed to, a seat member 337, with an appropriate fixing means such as brazing, such that the pin 332 extends perpendicularly to the seat member 337. The holding pin 214 includes, in the vicinity of the free end portion of the pin 332, a neck portion 352 similar to the neck portion 300 of the holding pin 212. In the present embodiment, the seat member 337 has such a shape which is somewhat larger than the diameter of the valve hole 226, e.g., a container-like shape having a circular cross section and having an inner diameter larger than the diameter of the valve hole 226. The seat member 337 provides the seat portion 331. A permanent magnet 338 is fixed to an inner space of the seat member 337, such that a lower surface of the magnet 338 is located somewhat inward of the annular seat surface 339 provided by the free end surface of the seat member 337. The pin 332 extends perpendicularly to the seat surface 339. In the present embodiment, all PWBs 24 have a same thickness, all holding pins 212 and all supporting pins 214 have a same height (i.e., a distance between the seat surface 329 and the support surface 288 or a distance between the seat surface 339 and the support surface 333), and all neck portions 300, 352 have a same height (i.e., a distance between the seat surface 329, 339 and the neck portion 300, 352. The thickness of each PWB 24 is defined as a thickness of a portion thereof free of any unevenness present on the back surface 215 thereof.

As shown in FIG. 1, a pin-storing device 340 as a supporting-member storing device or a holding-member storing device (hereinafter, referred to as the storing device 340) is provided adjacent to the PWB holding device 174. The storing device 340 stores a plurality of holding pins 212 and a plurality of supporting pins 214. In the present embodiment, the storing device 340 is elongate in the X-axis direction and has, in the Y-axis direction, a length somewhat smaller than a minimum distance between the fixed and movable guides 188, 190, so that the pins 212, 214 stored in the storing device 340, provided on the side of the fixed guide 188, do not interfere with the movable guide 190. The storing device 340 is not shown in FIG. 3.

Figure 14:
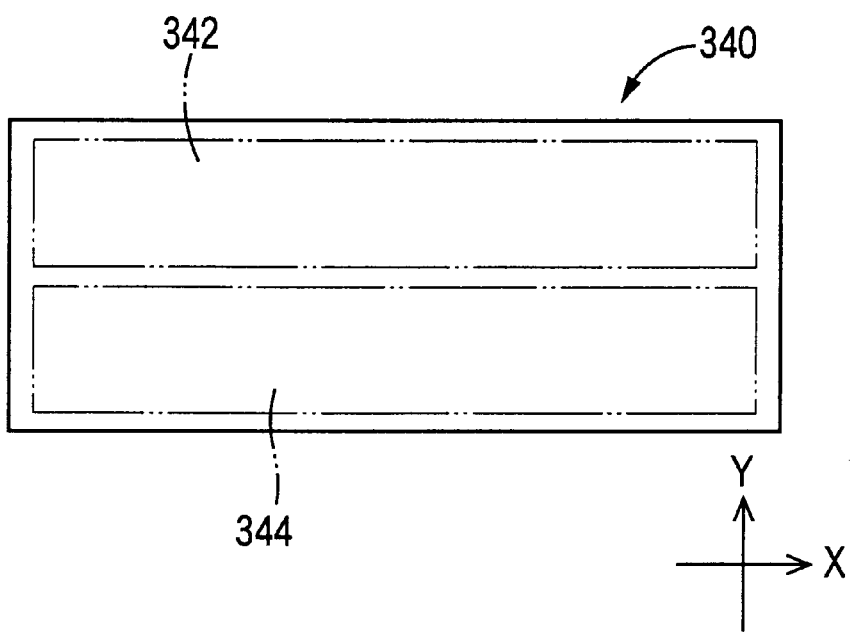
FIG. 14 is a plan view of a pin-storing device of the resetting apparatus.

The storing device 340 includes a supporting or storing table, not shown, that supports and stores the holding pins 212 and the supporting pins 214. As schematically shown in FIG. 14, the supporting table has a holding-pin storing area 342 which stores a plurality of holding pins 212, and a supporting-pin storing area 344 which stores a plurality of supporting pins 214. In the present embodiment, it is assumed for easier understanding purposes only that the plurality of holding pins 212 stored in the holding-pin storing area 342 have a same shape and a same size and the plurality of supporting pins 214 stored in the supporting-pin storing area 344 have a same shape and a same size. The two areas 342, 344 are arranged in the Y-axis direction, and each are adjacent to the PWB holding device 174 in the X-axis direction.

The holding-pin storing area 342 has a plurality of prescribed storing positions at each of which a holding pin 212 is stored; and the supporting-pin storing area 344 has a plurality of prescribed storing positions at each of which a supporting pin 214 is stored. For example, the two storing areas 342, 344 have, at each of the storing positions thereof, a recess, not shown, in which a lower portion of the seat member 320, 337 of a holding pin 212 or a supporting pin 214 fits. The recess has a transverse cross section shape similar to that of the seat member 320, 337, and has a size somewhat greater than that of the seat member 320, 337. Each of the two storing areas 342, 344 has a plurality of recesses in the X-axis direction and a plurality of recesses in the Y-axis direction. An upper open end of each of the recesses is tapered in an upward direction, and the tapered open end guides the fitting of a holding or supporting pin 212, 214 into the each recess. In the present embodiment, the recesses of the holding-pin storing area 342 are formed such that when the holding pins 212 fit in those recesses, respective lengthwise directions of the respective seat members 320 of the holding pins 212 are parallel to the X-axis direction, and the recesses of the supporting-pin storing area 344 are formed such that when the supporting pins 214 fit in those recesses, each pair of supporting pins 214 adjacent to each other in the X-axis direction or the Y-axis direction are spaced from each other by a distance which assures that a pair of grasping fingers 370 of a pin holder 368, described later, can be opened and closed in that space. Initially, an operator manually stores the holding pins 212 and the supporting pins 214 in the storing device 340. However, it is possible to automatically store the pins 212, 214 in the storing device 340. The recesses may be replaced with marks defining the storing positions. For example, marks which have the same shape and size as those of the cross section of the seat members 320 or 337 are depicted on a supporting surface of the storing device 340 that supports the holding pins 212 and the supporting pins 214, and the pins 212, 214 are set on the marks, respectively.

In the present embodiment, at least a surface portion of the supporting table of the storing device 340 in which the above-described recesses are formed is formed of steel as a sort of ferromagnetic material. Therefore, when a holding pin 212 or a supporting pin 214 fits in a recess of the supporting table, the supporting table is magnetized, and the pin 212 or 214 is fixed by a magnetic force to the supporting table.

The holding pins 212 and the supporting pins 214 are stored in the storing device 340, such that the pins 122, 214 fit in the recesses formed in the storing areas 342, 344 and take a vertical posture oriented upward. Respective bottom surfaces of the recesses, that is, the support surfaces that support the holding pins 212 and the supporting pins 124 take the same height position as that of the holding surface 244 of the holding table 210 of the PWB holding device 174 being positioned at its downward-movement-end position. Therefore, the holding pins 212 and the supporting pins 214 stored in the storing device 340 take the same height position as that of the holding pins 212 and the supporting pins 214 attached to the holding table 210 being positioned at its downward-movement-end position. In addition, the respective neck portions 300, 352 of the pins 212, 214 have a same height.

Figure 7:
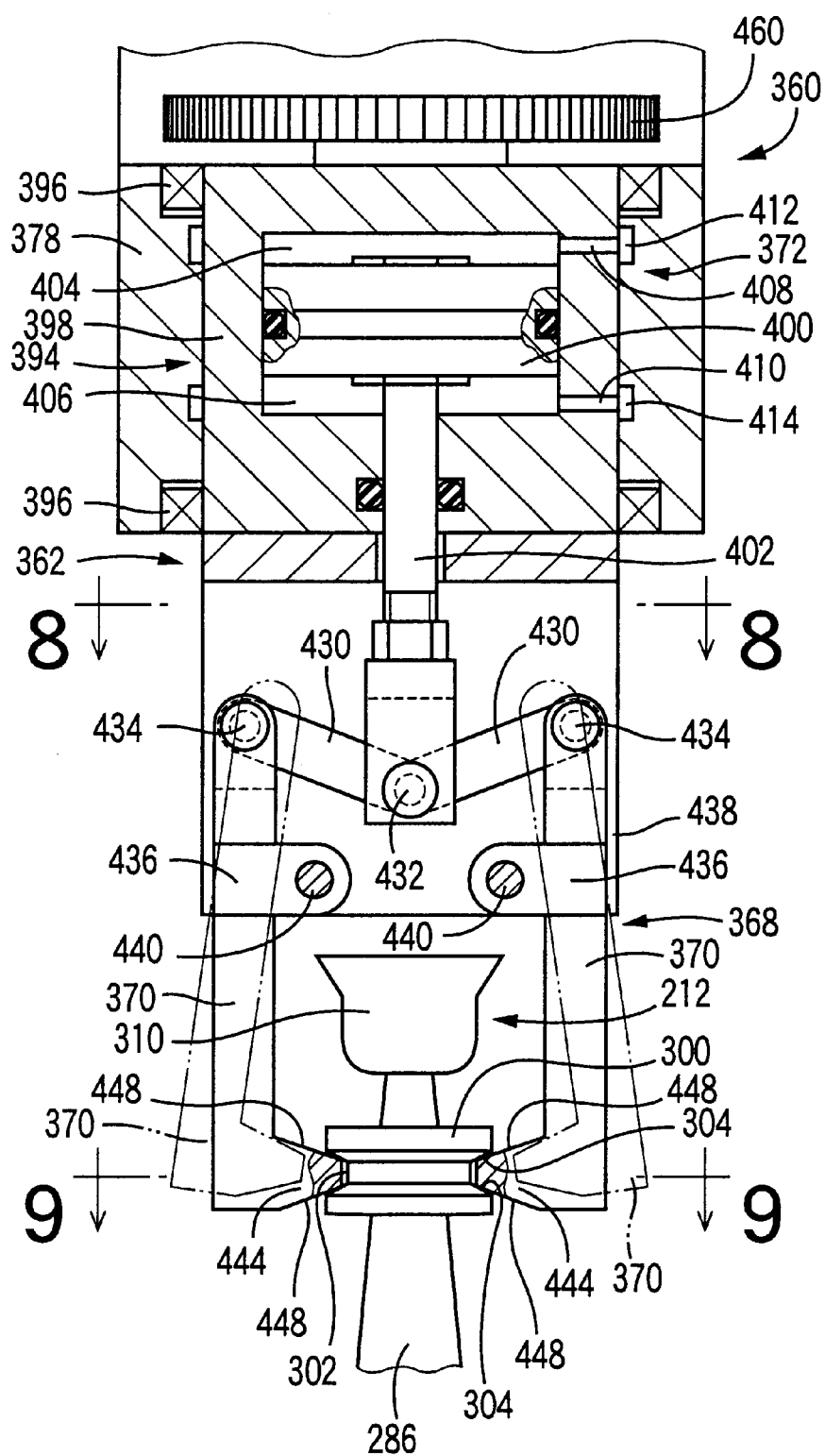
FIG. 7 is a partly cross-sectioned, side elevation view of a holding head of the resetting apparatus.

In the present embodiment, the setting and resetting of each holding pin 212 or each supporting pin 214 to and from the holding table 210 are automatically performed by utilizing the X-Y robot 48 of the EC mounting device 16. To this end, as shown in FIGS. 2 and 7, the Y-axis table 42 supports a holding unit 360 which includes a holding head 362; a rotating device 364 which rotates the holding head 362 about a vertical axis line perpendicular to the holding surface 244 of the holding table 210; and an elevating and lowering device 366 which elevates and lowers the holding head 362. The holding head 362 includes a pin holder 368 as a holding-member holder or a supporting-member holder; and a finger drive device 372 (FIG. 7) that opens and closes a pair of grasping fingers 370 as part of the pin holder 368. The holding head 362 is moved, by the X-Y robot 48, relative to the holding table 210, in directions parallel to the horizontal holding surface 244 of the table 210, and is moved by the elevating and lowering device 366 in directions perpendicular to the holding surface 244. The X-Y robot 48 and the elevating and lowering device 366 cooperate with each other to provide a moving device which moves the holding head 362 relative to each of the holding table 210 and the storing device 340 in the directions parallel to, and the directions perpendicular to, the holding surface 244; the moving device cooperates with the holding head 362 and the rotating device 364 to provide a mechanical portion of the resetting apparatus; and the mechanical portion cooperates with the storing device 340 and a portion of a control device 500, described later, that controls the mechanical portion, to provide the resetting apparatus which resets the PWB holding device 174.

Figure 10:
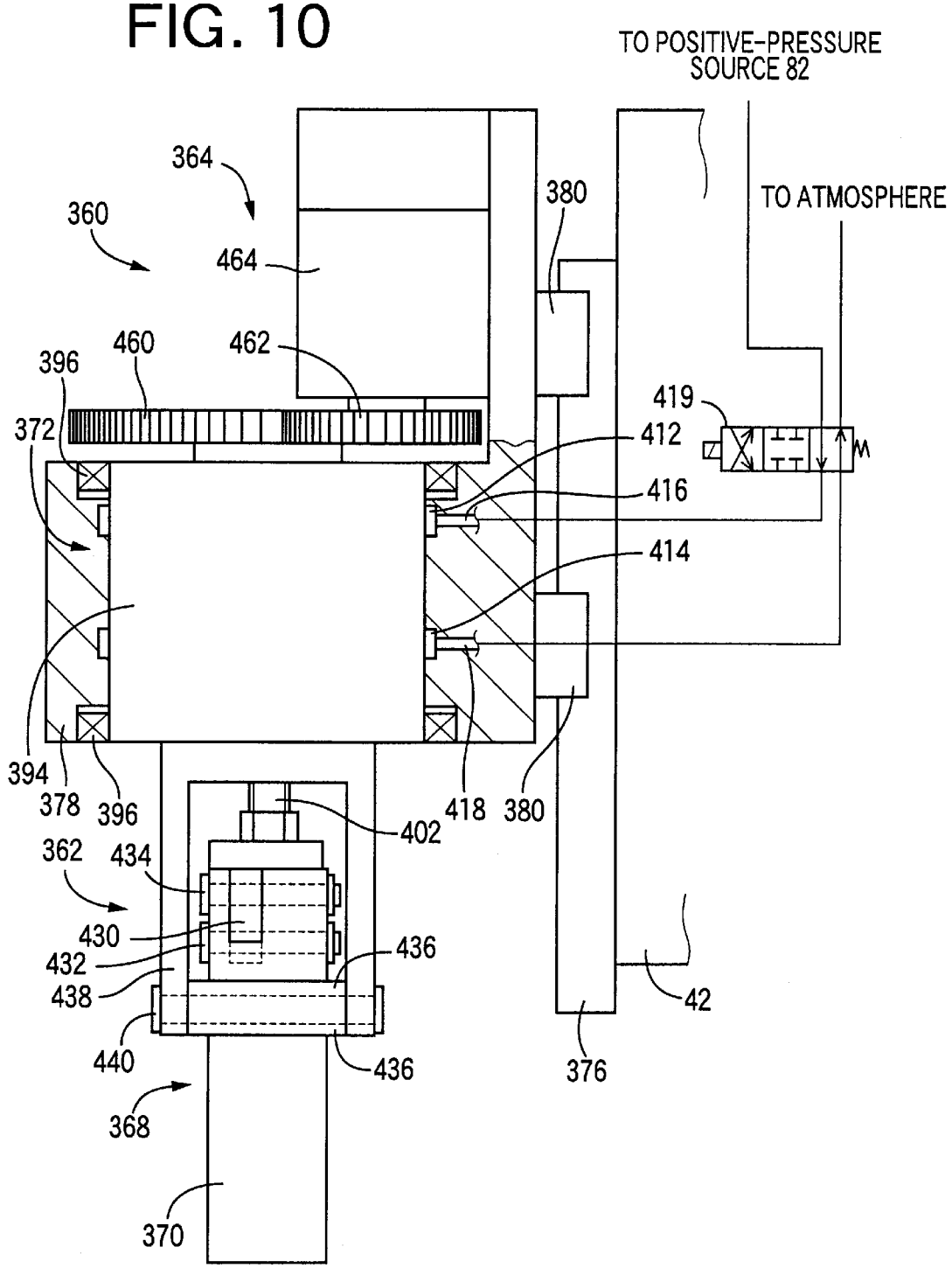
FIG. 10 is a partly cross-sectioned, front elevation view of the holding unit including the holding head.
Figure 11:
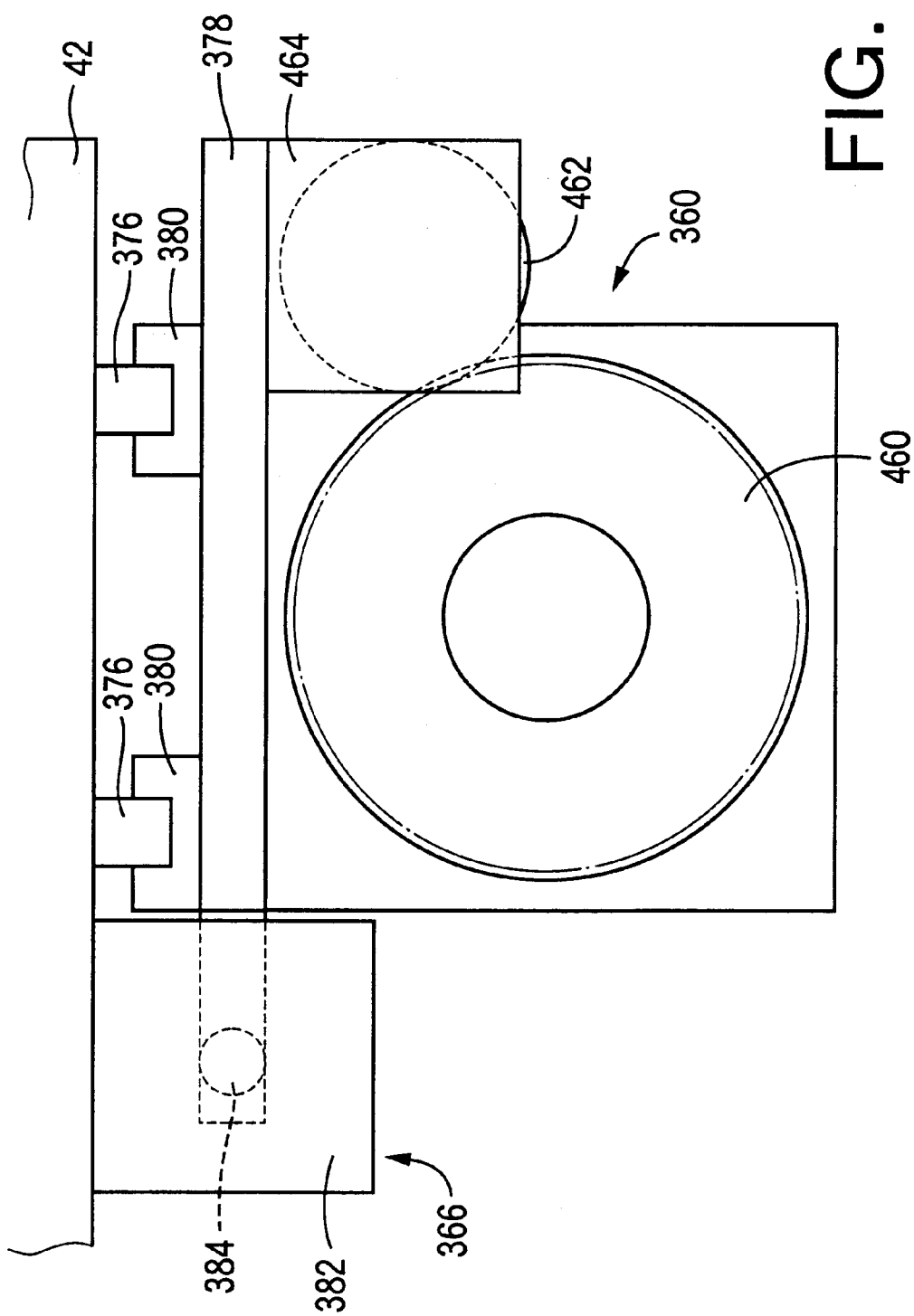
FIG. 11 is a plan view of the holding unit.

As shown in FIGS. 2 and 10, the vertical side surface 50 of the Y-axis table 42 supports a pair of guide rails 376 each as a guide member, such that the guide rails 376 are vertical, and an elevator table 378 fits via respective guide blocks 380 each as a guided member on the guide rails 376, such that the elevator table 378 is movable relative to the Y-axis table 42. In addition, the Y-axis table 42 supports a pressurized-air-operated cylinder device 382 as a pneumatic actuator as a sort of a pressurized-fluid-operated actuator as a drive source, such that the air-operated cylinder 382 is oriented downward. As shown in FIGS. 2 and 11, a piston rod 384 is engaged with the elevator table 378. Two air chambers of the air-operated cylinder 382 are selectively communicated with the positive-pressure source 82 and the atmosphere, respectively, or the atmosphere and the source 82, respectively, by a switching operation of a solenoid-operated direction-switch valve 386, so that the piston rod 384 is advanced or retracted and the elevator table 378 is lowered or elevated. Thus, the air-operated cylinder 382 and so on provides the elevating and lowering device 366. In the present embodiment, the direction-switch valve 386 is mounted on the Y-axis table 42, and is connected to the positive-pressure source 82 via the previously-described connector provided on the Y-axis table 42.

As shown in FIGS. 7 and 10, the elevator table 378 supports a pressurized-air-operated cylinder device 394 via bearings 396 such that the air-operated cylinder 394 is rotatable relative to the elevator table 378 about a vertical axis line and is not movable relative to the table 378 in an axial direction. A piston 400 air-tightly fits in a housing 398 of the air-operated cylinder 394, such that the piston 400 is movable in an axial direction. A piston rod 402 which is integral with the piston 400 projects downward from the piston 400, air-tightly through the wall of the cylinder housing 398, and extends out of the housing 398.

The piston 400 fits in the cylinder housing 398, SO that two air chambers 404, 406 are provided on both sides of the piston 400, respectively, and are connected to the positive-pressure source 82 via respective ports 408, 410 formed in the housing 398, respective annular passages 412, 414 formed in the elevator table 378, respective passages 416, 418 (FIG. 10), and a solenoid-operated direction-switch valve 419. The direction-switch valve 419 is connected to the above-described connector and to the positive-pressure source 82. Thus, the two air chambers 404, 406 are communicated with the positive-pressure source 82 and the atmosphere, respectively, or vice versa, by a switching operation of the direction-switch valve 519, SO that the piston 400 is moved and the piston rod 402 is advanced or retracted.

In the present embodiment, the various solenoid-operated direction-switch valves including the valve 68 are mounted on the Y-axis table 42, and the switching operations to switch the respective supplies of the positive pressure and the negative pressure to the various devices, including the EC mounting head 30, that are mounted on the Y-axis table 42 and need the positive pressure and the negative pressure are performed on the Y-axis table 42. Therefore, the distance between each of the direction-switch valves and a corresponding one of the devices that are operated based on the positive-pressure air or the negative pressure is short, and accordingly those devices exhibit a quick response.

Figure 8:
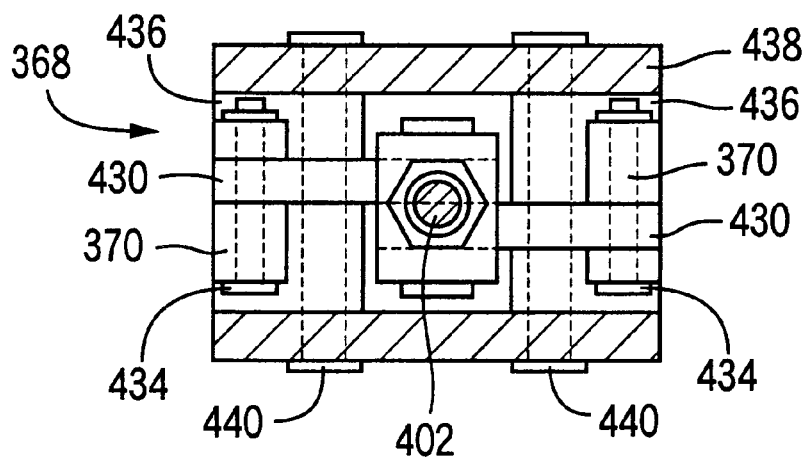
FIG. 8 is a cross-section view taken along 8—8 in FIG. 7.

As shown in FIG. 7, a pair of links 430 are attached, at respective one end portions thereof, to a lower end portion of the piston rod 402 via a pin 432, such that each of the links 430 is pivotable about a horizontal axis line. Respective other end portions of the links 430 are connected to the two grasping fingers 370 via respective pins 434, such that each of the fingers 370 is pivotable about a horizontal axis line. As shown in FIGS. 7 and 8, each of the two grasping fingers 370 includes an ear portion 436 at a position near to a corresponding one of the two links 430, and each of the respective ear portions 436 of the fingers 370 is pivotally connected to a corresponding one of two pins 440 supported by a bracket 438 which is integral with the cylinder housing 398.

Respective lower end portions of the two grasping fingers 370 are perpendicularly bent toward each other to provide respective engaging portions 444. As shown in FIG. 9, each of the engaging portions 444 has, at a free end thereof, a recess 446 having a V-shaped cross section. As shown in FIG. 7, an upper and a lower surface of each of the engaging portions 444 are inclined to provide respective inclined surfaces 448 each having an inclination corresponding to that of the inclined side surfaces 304 of the circular groove 302 of the neck portion 300, 352 of each holding pin 212 or each supporting pin 214. The two grasping fingers 370 grasp the holding pin 212 or the supporting pin 214 in such a manner that the respective engaging portions 444 enter and engage the circular groove 302 of the neck portion 300 or 352. In the present embodiment, the respective pairs of inclined surfaces 448 of the two engaging portions 444 engage the side surfaces 304 of the annular groove 302, and thereby grasp the holding pin 212 or the supporting pin 214 without tilting the same 212, 214. The recess 446 of each of the two engaging portions 444 defines a V-shaped space which assures that the inclined surfaces 448 engage the side surfaces 304, and thereby grasp the neck portion 300 or 352, or grasp the pin 212 or 214 with a small clearance being left between the surfaces 448 and the neck portion 300, 352.

When the piston rod 402 is moved downward, the two grasping fingers 370 are pivoted, as indicated at two-dot-chain line, such that the respective engaging portions 444 are moved away from each other, so that the holding pin 212 or the supporting pin 214 is released. On the other hand, when the piston rod 402 is moved upward, the two grasping fingers 370 are pivoted, as indicated at solid line, such that the respective engaging portions 444 are moved toward each other, so that the holding pin 212 or the supporting pin 214 is grasped such that the pin 212 or 214 is coaxial with the axis line of the air cylinder 394, i.e., the axis line of the pin holder 368. Thus, the piston rod 402, the links 430, the grasping fingers 370, and the bracket 438 are so connected to one another that the grasping fingers 370 grasp and release the holding pin 212 or the supporting pin 124 owing to a toggle mechanism. Thus, the pin 212, 214 is strongly grasped by the pin holder 368. In the present embodiment, the bracket 438 provides a main member of the pin holder 368 that cooperates with the links 430 and the grasping fingers 370 to provide the pin holder 368. The rotating device 364 which rotates the pin holder 368 is elevated and lowered with the holder 368 and so on. The air cylinder 394 and so on provide the finger drive device 372.

As shown in FIG. 7, a driven gear 460 is provided on an upper surface of the cylinder housing 398, such that the driven gear 460 is coaxial with the housing 398 and is not rotatable relative to the same 398. As shown in FIG. 11, the driven gear 460 is meshed with a drive gear 462 and, when the drive gear 462 is rotated by a rotating motor 464, the drive gear 462 is rotated, so that the air cylinder 394 is rotated about the vertical axis line and the pin holder 368 is rotated about the same vertical axis line. The rotating motor 464 are provided on the elevator table 378, and cooperates with the drive gear 462, the driven gear 460, and so on to provide the rotating device 364. The air chambers 404, 406 of the air cylinder 394 are supplied with the air via the respective annular passages 412, 414, so that even if the air cylinder 394 is rotated, the air chambers 404, 406 can continuously receive the air.

Figure 15:
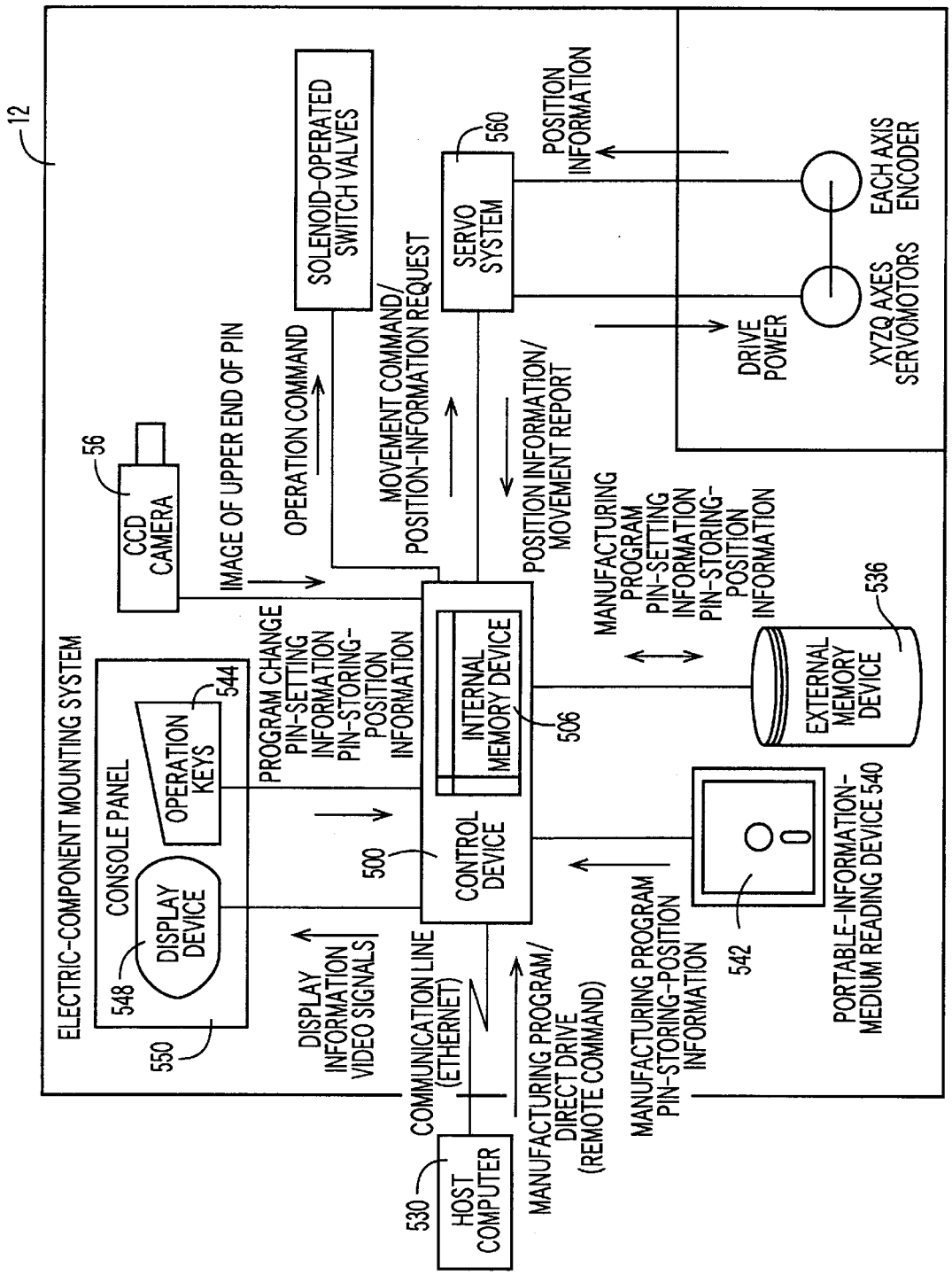
FIG. 15 is a view illustrating various functions of a control device which controls the EC mounting system.
Figure 16:
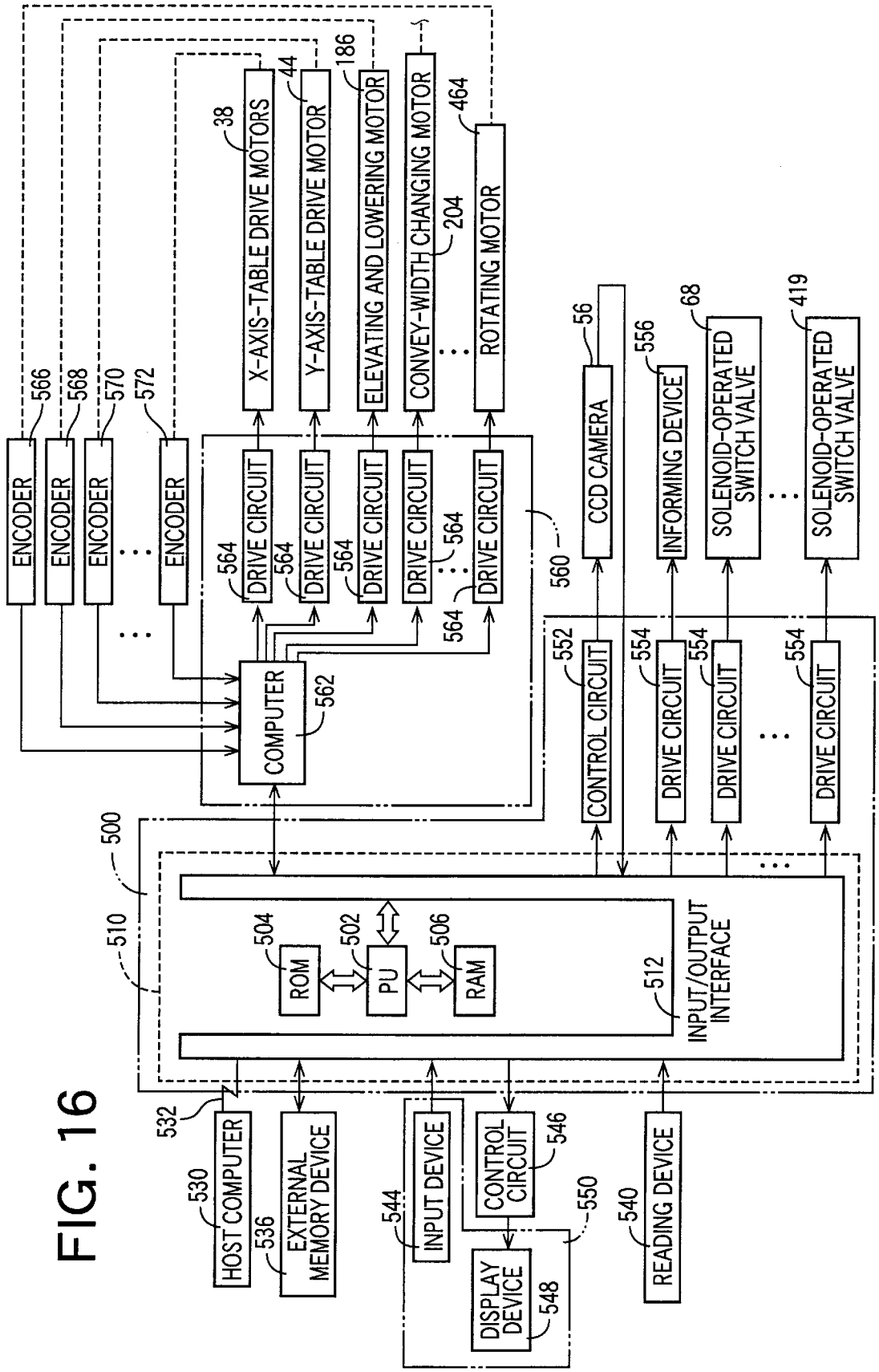
FIG. 16 is a diagrammatic view of the control device.

The present EC mounting system 12 is controlled by a control device 500 shown in FIGS. 15 and 16. FIG. 15 shows respective control functions of a control system employed in the EC mounting system 12; and FIG. 16 schematically shows the control system. The control device 500 is essentially provided by a computer 510 including a PU (processing unit) 502, a ROM (read only memory) 504, a RAM (random access memory) 506, and a bus which connects those elements 502, 504, 506 to one another. The ROM 504 stores a main routine, not shown, and a pin-storing routine and a pin-setting routine which are represented by respective flow charts shown in FIGS. 20 and 21. An input/output interface 512 is connected to the bus of the computer 510, on one hand, and is connected, on the other hand, a host computer 530 which supervises not only the EC mounting system 12 but also other systems and devices used for producing the PWBs 24. In the present embodiment, the host computer 530 and the EC mounting system 12 are connected to one another via a communication line 532 such as Ethernet, so that the host computer 530 transmits a manufacturing program to the computer 510, and the computer 510 transmits manufacturing-relating information to the host computer 530. The computer 510 stores the manufacturing program received from the host computer 530, in an external memory device 536 connected to the input/output interface 536. The external memory device 536 can store different sorts of manufacturing programs.

In the present embodiment, when an operator operates the host computer 530, the host computer 530 transmits a manufacturing program to the computer 510 of the EC mounting system 12, and the transmitted manufacturing program is stored in the external memory device 536. Alternatively, it is possible that the transmitted manufacturing program be stored in the RAM 506 of the computer 510. Each manufacturing program includes PWB-relating information which relates to PWBs 24 as objects on which ECs 32 are to be mounted; and pin-setting information which is to be used to set the holding pins 212 and the supporting pins 214 on the holding table 210. The PWB-relating information includes information representing a width, a length, a sort, etc. of each PWB 24 to be used. The pin-setting information includes data representing a total number of the holding pins and the supporting pins 214 that are to be set on the holding table 210. For each holding pin 212, in particular, the pin-setting information additionally includes data representing the sort of the each pin 212 (i.e., the fact that the each pin 212 is not a supporting pin 214 but a holding pin 212); setting-position data representing a setting position where the each pin 212 is to be set on the holding surface 244 of the holding table 210; and rotation-position data representing a rotation position at which the each pin 212 is to be mounted on the holding surface 244. In the present embodiment, the holding surface 244 is a horizontal surface, and the setting-position data is horizontal-direction-position data representing a position, in a horizontal direction, where each holding pin 212 is to be set on the holding surface 244. The rotation position is an angular phase of each holding pin 212 about an axis line of the pin 286 thereof e.g., a vertical axis line in the present embodiment, and defines a direction in which the elongate seat member 320 thereof extends. The pin-setting information includes, for each supporting pin 214, data representing the sort of the each pin 214; horizontal-direction-position data representing a setting position where the each pin 214 is to be set; and rotation-position data representing a rotation position in which the two grasping fingers 370 of the pin holder 368 are opposed to each other. Since the seat member 337 of each supporting pin 214 has a circular shape, it does not matter with the rotation position of the each pin 214. Therefore, the pin-setting information does not include rotation-position data representing a rotation position where each supporting pin 214 is to be set. However, when the pin holder 368 sets each supporting pin 214 on the holding table 210 or resets each supporting pin 214 from the holding table 210, the pin holder 368 must not interfere with the other holding or supporting pins 212, 214. To this end, the pin-setting information includes rotation-position data representing a rotation position in which the two grasping fingers 370 of the pin holder 368 are opposed to each other to set or reset each supporting pin 214.

In the present embodiment, the horizontal-direction position and rotation position of each holding pin 212 and the horizontal-direction position of each supporting pin 214 are so determined as to satisfy both a first condition given for the PWB 24 and a second condition given for the PWB holding device 174. The first condition is that each pin 212, 214 can engage a portion of the PWB 24 that is free of the ECs 32 mounted thereon and is free of unevenness and the suction cup 310 or the support surface 333 can closely contact the PWB 24 without interfering with the ECs 32 mounted thereon. A batch of design data for each sort of PCB 24 includes data representing respective positions on the back surface of the PWB 24 where ECs 32 are to be mounted, and respective positions where the back surface of the PWB 24 has unevenness. Meanwhile, each holding pin 212 has the function of sucking the PWB 24 and thereby correct an upward warpage thereof, and each holding or supporting pin 212, 214 has the function of supporting, at the support surface 288, 333, the lower surface of the PWB 24 and thereby correct a downward warpage thereof. Therefore, a horizontal-direction position where each holding or supporting pin 212, 214 is to be set relative to the PWB 24 is determined, based on the design data for the PWB 24, such that the each pin, set at the horizontal-direction position, can hold or support a portion of the PWB 24 that allows the holding or the supporting and can appropriately hold or support the PWB 24 according to the characteristic of the each pin.

The above-indicated second condition is, for each holding pin 212, such that the seat member 320 of each holding pin 212 does not interfere with the seat members 320, 337 of the other holding or supporting pins 212, 214, and closely contacts a portion of the holding surface 244 that surrounds the opening of one negative-pressure-supply hole 224, so as to cover completely the supply hole 224. The second condition for each supporting pin 214 is that the seat member 337 of each supporting pin 214 does not interfere with the seat members 320, 337 of the other holding or supporting pins 212, 214, and closely contacts a portion of the holding surface 244 that surrounds the opening of one negative-pressure-supply hole 224, SO as to cover completely the hole 224, and that each supporting pin 214 has, around the neck portion 352 thereof, a space in which the two grasping fingers 370 of the pin holder 368 can be opened and closed in at least one direction.

Since the seat member 320 of each holding pin 212 is elongate and the pin 286 thereof is connected to the lengthwise middle portion of the seat member 320, the pin 286 can be positioned, on the holding table 210, at an arbitrary position within a circle whose radius is equal to the distance between the central axis of the pin 286 and the center of the hole 224 and whose center coincides with the center of the hole 224. The distance between the central axis of the pin 286 and the center of the hole 224 takes a maximal value when the hole 224 is aligned with one of opposite end portions of the seat member 320. Therefore, the pin 286 can be positioned at an arbitrary position within a circle whose radius is equal to the maximal value. In the present embodiment, the respective circles associated with the plurality of negative-pressure-supply holes 224 overlap each other to cover substantially entirely the holding surface 244 of the holding table 210. Thus, the pin 286 of each holding pin 212 can be positioned at an arbitrary position on the holding surface 244 of the holding table 210. However, in the case where a plurality of holding pins 212 are set on the holding table 210, the respective seat members 320, 337 of the holding and/or supporting pins 212, 214 must not interfere with each other. This limits the respective positions where the holding pins 212 are set. Although each supporting pin 214 can be set on any portion of the holding table 210 that may or may not have a negative-pressure-supply hole 224, the supporting pin 214 must satisfy the above-described condition. This limits the respective positions where the supporting pins 214 are set.

Even in the case where the seat member 320 of each holding pin 212 covers only a portion of a negative-pressure-supply hole 224, an opening and closing valve 260 present in the supply hole 224 may be opened when a ball 268 of the valve 260 is magnetically attracted by the holding pin 212 set on the holding table 210, so that negative pressure may leak from the supply hole 224 via the communication holes 240 into the atmosphere. This is why the seat member 320 of each holding pin 212 must closely contact the holding surface 244 and completely cover the supply hole 224. Meanwhile, each supporting pin 214 does not apply negative pressure to the PWB 24 to hold it. However, each supporting pin 214 is magnetically fixed to the holding table 210. Therefore, when the seat member 337 of each supporting pin 214 covers a portion of one negative-pressure-supply hole 224, the ball 268 is magnetically attracted and the opening and closing valve 260 is opened, so that the negative pressure may leak. As shown in FIG. 13, when the seat member 337 is set at a position where the seat surface 339 thereof closely contacts a portion of the holding surface 244 that surrounds the opening of the valve hole 226 and completely covers the valve hole 226, the negative pressure does not leak even if the valve 260 may be opened. Therefore, each supporting pin 214 can be set at such a position.

Thus, the horizontal-direction positions and rotation positions of the holding pins 212 and the horizontal-direction positions of the supporting pins 214 are so determined automatically, or by an operator, as to satisfy both the condition given to the PWB 24 and the condition given to the PWB holding device 174.

Each of a plurality of holding pins 212 and a plurality of supporting pins 124 which are to be set on the holding table 210 is given a pin number, np, and the pin-setting information includes, in association with each pin number np, the sort of a corresponding pin; and, for each holding pin 212, a horizontal-direction position and a rotation position thereof and, for each supporting pin 214, a horizontal-direction position thereof and a rotation position of the pin holder 368, as schematically shown in FIG. 17. The horizontal-direction position of each holding or supporting pin 212, 214 with pin number np is expressed by a set of x and y coordinates, $(X_{np}, Y_{np})$, of the center thereof (i.e., the axis line of the pin 286, 332 thereof); and the rotation position of each holding pin 212 or the pin holder 368 is expressed by an angle, $\theta_{np}$, of the lengthwise direction of the seat member 320 of the holding pin 212 or the direction in which the two grasping fingers 370 of the pin holder 368 are opposed to each other, as measured from a reference rotation position (i.e., an angle of 0 degree) parallel to the X-axis direction, in a clockwise or positive direction or in a counterclockwise or negative direction, under the condition that the holding pin 212 or the pin holder 368 is seen from the side of the support surface 288 of the pin 212 or the top of the holder 368. The sequential pin numbers np represent a prescribed setting order in which the holding and supporting pins 212, 214 are to be set on the holding table 210. In the present embodiment, the setting order is so prescribed that the earlier pins 212, 214 are set at the remoter setting positions on the holding table 210 from the storing device 340.

The host computer 530 can directly supply, owing to a remote command via the communication line 532, the PWB-relating information relating to the PWB 24, the pin-setting information needed to set the holding and supporting pins 212, 214, etc., to the computer 510. The computer 510 can store the supplied information in an internal memory device provided by the RAM 506.

A reading device 540 is connected to the input/output interface 512. The reading device 540 reads in or writes out control information, e.g., a manufacturing program, recorded on a CD-ROM 542 (FIG. 15) as a sort of portable information-recording medium. This manufacturing program includes PWB-relating information relating to a PWB 24, pin-setting information needed to set holding and supporting pins 212, 214, etc. Thus, the computer 510 can obtain pin-setting information from the CD-ROM 542. The manufacturing program read by the reading device 540 is stored in the external memory device 536.

An input device 544 is also connected to the input/output interface 512. The input device 544 includes operable keys including numeric keys and function keys, and an operator can select, through the input device 544, one of a plurality of manufacturing programs, or input PWB-relating information relating to a PWB 24, pin-setting information needed to set holding and supporting pins 212, 214, or pin-storing information needed to store the pins 212, 214. Thus, the computer 510 can obtain pin-setting information input by the operator through the input device 544. The computer 510 stores the thus obtained pin-setting information in the RAM 506.

Figure 18:
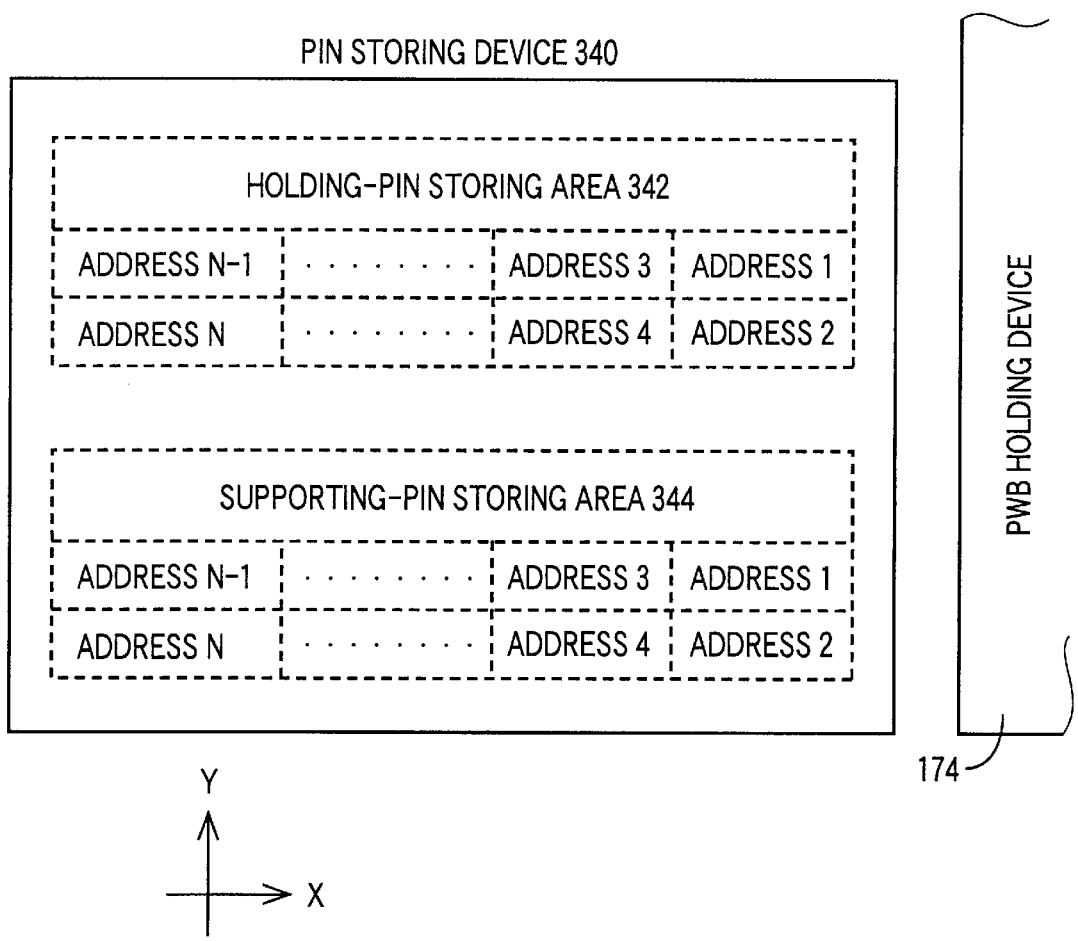
FIG. 18 is a view for explaining a manner in which the two sorts of pins are stored in the pin-storing device.

In the present embodiment, the pin-storing information is input by the operator through the input device 544, and is stored in the RAM 506. In the present embodiment, the pin-storing information includes an address where each holding pin 122 is stored in the storing area 342 of the storing device 340, or an address where each supporting pin 214 is stored in the storing area 344 of the storing device 340. As schematically shown in FIG. 18, each of the storing positions in the holding-pin storing area 342 or the supporting-pin storing area 344 of the storing device 340 is given an address, N. In the present embodiment, the smaller addresses N are given to the nearer storing positions to the PWB holding device 174. A relationship between each address N, and x and y coordinates representing a corresponding storing position is defined by a prescribed table which is stored in the ROM 504. The storing position represented by the x and y coordinates is a position taken by the axis line of the pin 286, 332 of each holding or supporting pin 212, 214 in the storing device 340.

The holding-pin storing area 342 and the supporting-pin storing area 344 store respective numbers of holding pins 212 and supporting pins 214 that can hold or support each of a plurality of sorts of PWBs 24. Therefore, when the current sort of PWBs 24 on each of which ECs 32 are to be mounted are changed to a new sort of PWBs 24 and a resetting operation is performed to reset the PWB holding device 174, only the current pin-setting information is changed to new pin-setting information corresponding to the new sort of PWBs 24. As described previously, the holding pins 212 and the supporting pins 214 are initially stored in the storing device 340, by the operator. More specifically described, the holding pins 212 or the supporting pins 214 are stored in the respective consecutive addresses in the holding-pin storing area 342 or the supporting-pin storing area 344, respectively, such that there are no empty addresses among the addresses filled with the pins 212, 214. The operator inputs, as the pin-storing information, the smallest address that is the most nearest to the PWB holding device 174 and the largest address that is the remotest from the same 174. However, it is possible that the pin-storing information be supplied from the CD-ROM 542 and be stored in the external memory device 536.

A display device 548 is connected via a control circuit 546 to the input/output interface 512, as shown in FIG. 16. The display device 548 cooperates with the input device 544 to provide a console panel 550. The display device 548, which is provided by a CRT (cathode ray tube) in the present embodiment, displays display information and video signals supplied from the computer 510. In addition, the CCD camera 56 is connected via a control circuit 552 to the input/output interface 512; and an informing device 556, the solenoid-operated direction-switch valve 68, etc. are connected via respective drive circuits 554 to the interface 512. Thus, image data representing the image taken by the CCD camera 56 are input to the computer 510. The informing device 556 may be a buzzer or a lamp which generates an alarm sound, or lights or flashes, to inform the operator of occurrence of an abnormality. Alternatively, the display device 548 may be operated to inform the operator of occurrence of an abnormality. In the latter case, the display device 548 functions as the informing device.

A servo system 560 is connected to the input/output interface 512. In the present embodiment, the servo system 560 includes a computer 562 and drive circuits 564. The computer 562 has a construction similar to that of the computer 510, and are connected via various actuators including the respective drive circuits 564 to the X-axis-table drive motors 38, the Y-axis-table drive motor 44, and the elevating and lowering motor 186 for elevating and lowering the PWB lifter 176. The motors employed in the present EC mounting system 12, such as the X-axis-table drive motors 38, are servomotors each as a sort of electric motor as a drive source. However, the servomotors may be replaced with a different sort of motors that can be controlled with respect to rotation amount or angle, e.g., stepper motors. The respective rotation angles of those motors, including the X-axis-table drive motors 38, the Y-axis-table drive motor 44, the elevating and lowering motor 186, and the rotating motor 464, are detected by respective encoders 566, 568, 570, 572 each as a rotation detecting device, and the detected rotation angles are input to the computer 562

In the EC mounting system 12 constructed as described above, ECs 32 are mounted on a PWB 24 according to one of the manufacturing programs which are stored in the external memory device 536. The display device 548 can display a list of all the manufacturing programs stored in the external memory device 536, so that the operator can select, through the input device 544, an appropriate one of the manufacturing programs. The thus selected manufacturing program is transferred from the external memory device 536 to the RAM 506, and is stored in the same. In the case where this manufacturing program includes pin-setting information to be used to set holding pins 212 and/or supporting pins 214, the pin-setting information is also stored in the RAM 506. In the case where pin-setting information is supplied according to a remote command from the host computer 530, or is input by the operator, the pin-setting information has already been stored in the RAM 506.

In the case where a different manufacturing program has been used before the thus selected manufacturing program, a resetting operation is performed before the selected manufacturing program is carried out. The resetting operation includes changing the PWB-convey width of the PWB conveyor 22, exchanging the ECs 32 supplied by the EC supplying device 18, rearranging the holding and supporting pins 212, 214 of the PWB holding device 174, and so on. After the resetting operation, ECs 32 are mounted on a PWB 24 according to the newly selected manufacturing program. Hereinafter, first, there will be described a manner in which the holding pins 212 and the supporting pins 214 are attached to the holding table 210 to support the PWB 24 and ECs 32 are mounted on the PWB 24.

As described previously, the lower or back surface of the PWB 24, opposite to the upper or front surface thereof on which ECs 32 are to be mounted, has some ECs 32 already mounted thereon and some uneven portions. Thus, each pin 212, 214 must support one of limited portions of the back surface. Meanwhile, the holding table 210 is used commonly for a plurality of sorts of PWBs 24, and has a size greater than that of the largest one of the different sorts of PWBs 24. Thus, the holding pins 212 are not attached to all the negative-pressure-supply holes 224 and, as shown in FIG. 19, the holding table 210 includes a first area, indicated at two-dot-chain line, which is not aligned with the PWB 24 because the PWB 24 is smaller than the table 210 and to which no holding or supporting pins 212, 214 are attached, and a second area which is aligned with the PWB 24 and includes first portions to which holding or supporting pins 212, 214 are attached and second portions to which pins 212, 214 are not attached.

As illustrated in the right-hand portion of FIG. 4, with respect to a negative-pressure-supply hole 224 to which a holding pin 212 is not attached, the ball 268 is seated, owing to its own weight, on the valve seat 262 and closes the open-and-close valve 260. On the other hand, with respect to a negative-pressure-supply hole 224 to which a holding pin 212 is attached, the seat surface 329 as the lower surface of the seat member 320 is closely contacted with a portion of the holding surface 244 of the holding table 210 that surrounds the opening of the hole 224. Since the permanent magnets 328 are fixed to the seat member 320 and the coming-off preventing plate 216 is formed of steel as ferromagnetic material, the plate 216 is magnetized and accordingly the holding pin 212 is attracted and fixed to the holding table 210 by the magnetic force. Since the permanent magnets 328 are located inward of the seat surface 329 of the seat member 320, the seat surface 329 is closely contacted with the holding surface 244 to prevent leakage of the negative pressure.

Since the ball 268 as the valve member of the open-and-close valve 260 is formed of steel and the base 218 in which the valve seat 262 is provided is formed of aluminum, the ball 268 is magnetized by the permanent magnets 328, but the valve seat 262 is not magnetized, so that the ball 268 is attracted by the coming-off preventing plate 216 and is moved away from the valve seat 262 and accordingly the open-and-close valve 260 is opened. However, the plate 216 prevents the ball 268 from coming off the valve hole 226. Since the coming-off preventing plate 216 with which the ball 268 is to be directly engaged is formed of ferromagnetic material and accordingly can be magnetized, a great magnetic force is exerted to the ball 268 so that the ball 268 is easily moved away from the valve seat 262. In addition, the ball 268 is partly accommodated in the positioning recess 272 formed in the plate 216, and accordingly is positioned relative to the communication holes 240 in a direction intersecting the directions in which the ball 268 is moved toward, and away from, the valve seat 262. Thus, the communication holes 240 are not closed by the ball 268, and accordingly the communication between the negative-pressure passage 326 and the negative-pressure supply hole 224 is maintained. In this state, the supply hole 224 is communicated with the passage 326 via the valve hole 226, and the communication holes 240 of the plate 216, so that the passage 326 is supplied with the negative pressure from the supply hole 224.

Like each holding pin 212, each supporting pin 214 is attracted and fixed, by a magnetic force, to the holding table 210. All of the holding pins 212 and the supporting pins 214 have a same height, so that in a state in which the holding and supporting pins 212, 214 are attached to the holding table 210, the respective support surfaces 288, 333 of those pins 212, 214 are positioned on a single plane (e.g., a horizontal plane in the present embodiment).

When ECs 32 are mounted on a WB 24, the PWB 24 is carried in by the PWB conveyor 22. At this time, the PWB holding device 174 is held at its downward-movement-end position by the PWB elevating and lowering device 170, so that the PWB 24 is carried in onto the PWB holding device 174, and contacted with, and stopped by, the stopper, not shown. Then, the holding device 174 is moved upward to its upward-movement-end position by the elevating and lowering device 170. When the PWB holding device 174 is moved upward, the solenoid-operated direction-switch valve, not shown, is switched to communicate the negative-pressure-supply holes 224 with the negative-pressure source 70, so that the negative pressure is supplied to the holding pins 212. Thus, the holding pins 212 are moved upward while sucking and holding the PWB 24. Eventually, the holding pins 212 lift up the PWB 24 off the conveyor belts 196, and press the same 24 against the PWB hold-down portions 194.

In the present embodiment, the distance of movement of the PWB holding device 174 is equal to a value which is obtained by subtracting the thickness of the PWB 24 from the distance between the hold-down portions 194 and the support surfaces 288 of the holding pins 212 positioned at their downward-movement-end position. The suction cups 320 are elastically deformed while sucking and holding the PWB 24. In the state in which the holding device 174 is positioned at its upward-movement-end position, the support surfaces 288 engage the PWB 24, cooperate with the hold-down portions 194 to sandwich the PWB 24, and support the lower surface of the PWB 24. Therefore, even if the PWB 24 may warp such that the PWB 24 is upwardly convex, the convex portion of the PWB 24 is corrected to extend along a single plane. When the PWB holding device 174 is moved upward, the supporting pins 214 contact, at the support surfaces 333 thereof, the back surface of the PWB 24. If the PWB 24 may warp such that the PWB 24 is downwardly convex, the convex portion of the PWB 24 is pushed up and corrected to extend along a single plane. Thus, the PWB holding device 174 holds the PWB 24 such that the PWB 24 takes a horizontal posture.

After the PWB holding device 174 is moved upward, the above-described clamping plates provided on the fixed and movable guides 188, 190 are moved upward by the clamping cylinders, so that the respective end portions of the PWB 24 are sandwiched and held by the clamping plates and the PWB hold-down portions 194.

During a time duration in which the ECs 32 are mounted on the PWB 24, the negative pressure is continuously supplied to the holding pins 212. Consequently the PWB 24 is sucked and held by the holding pins 212 and is kept horizontal, and the balls 268 of the opening and closing valves 260 present in the negative-pressure-supply holes 224 free of the holding pins 224 are seated, owing to their own weights, on the corresponding valve seats 262 and are pressed against the same 262 by the attractive forces applied thereto owing to the negative pressure. Thus, the leakage of the negative pressure is prevented. Since the balls 268 are seated on the valve seats 262 covered by the pads 266, the leakage of the negative pressure is more effectively prevented.

After in this way the PWB 24 is held by the PWB holding device 174, the X-Y robot 48 moves the CCD camera 56 to a plurality of positions at each of which the CCD camera 56 is opposed to a corresponding one of a plurality of fiducial marks provided on the PWB 24. Based on a batch of image data representing the taken images of the fiducial marks, the computer 510 determines positional errors of the PWB 24 held by the holding device 174, and stores the determined positional errors in the RAM 506 thereof. Subsequently, the EC mounting head 30 picks up an EC 32 from the EC supplying device 18 and conveys the EC 32 to a position right above an EC-mount place on the PWB 24. During the conveying of the EC 32, the EC-image-taking CCD camera takes an image of the EC 32 held by the head 32 and, based on a batch of image data representing the taken image of the EC 32, the computer 510 determines positional errors of the EC 32 held by the head 32. Based on the positional errors of the PWB 24 and the positional errors of the EC 32, the computer 510 modifies the distance of movement of the EC 32, and controls the rotating device 54 to rotate the EC 32, so as to correct the positional errors of the PWB 24 and the EC 32. The positional errors of the center of the EC 32 produced by correcting the rotation-position error of the EC 32 are also corrected by modifying the distance of movement of the EC 32. After this correcting step, the EC 32 is mounted, at a correct rotation position, at a correct EC-mount place on the PWB 24.

After the ECs 32 are mounted on the PWB 24, the clamping plates are moved down to release the PWB 24, and the PWB holding device 174 is moved down to its downward-movement-end position. At this time, the supplying of negative pressure is stopped and is not supplied to the negative-pressure-supply holes 224, so that the holding pins 212 do not hold the PWB 24. When the lower surface of the PWB 24 is supported on the conveyor belts 196, the holding pins 212 are separated from the PWB 24. The supporting pins 214 are also moved down, and are separated from the PWB 24. Then, the PWB 24 is carried out by the PWB conveyor 22, and another PWB 24 is carried in so that ECs 32 are mounted on the new PWB 24.

If ECs 32 have been mounted on all PWBs 24 according to a certain manufacturing program, and another manufacturing program is selected so that according to the new program, ECs 32 are mounted on PWBs 24, a resetting operation is performed before the new program is carried out. Hereinafter, a resetting operation for resetting the PWB holding device 174 will be described. Since the width of the PWB conveyor 22 is automatically changed and this changing is not relevant to the present invention, the description thereof is omitted.

Figure 20:
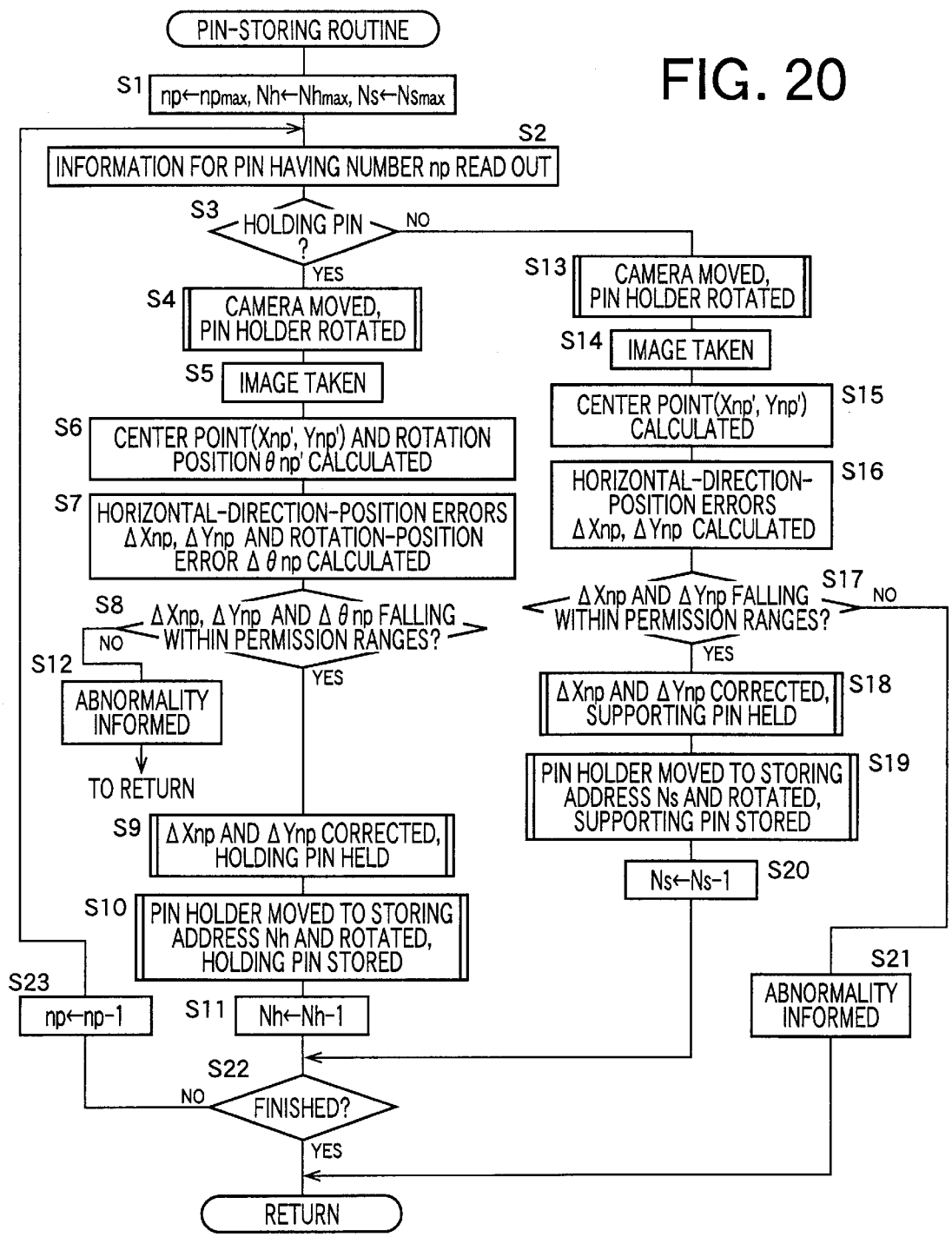
FIG. 20 is a flow chart representing a pin-storing routine according to which the control device operates for storing the holding pins and the supporting pins in the storing device.
Figure 21:
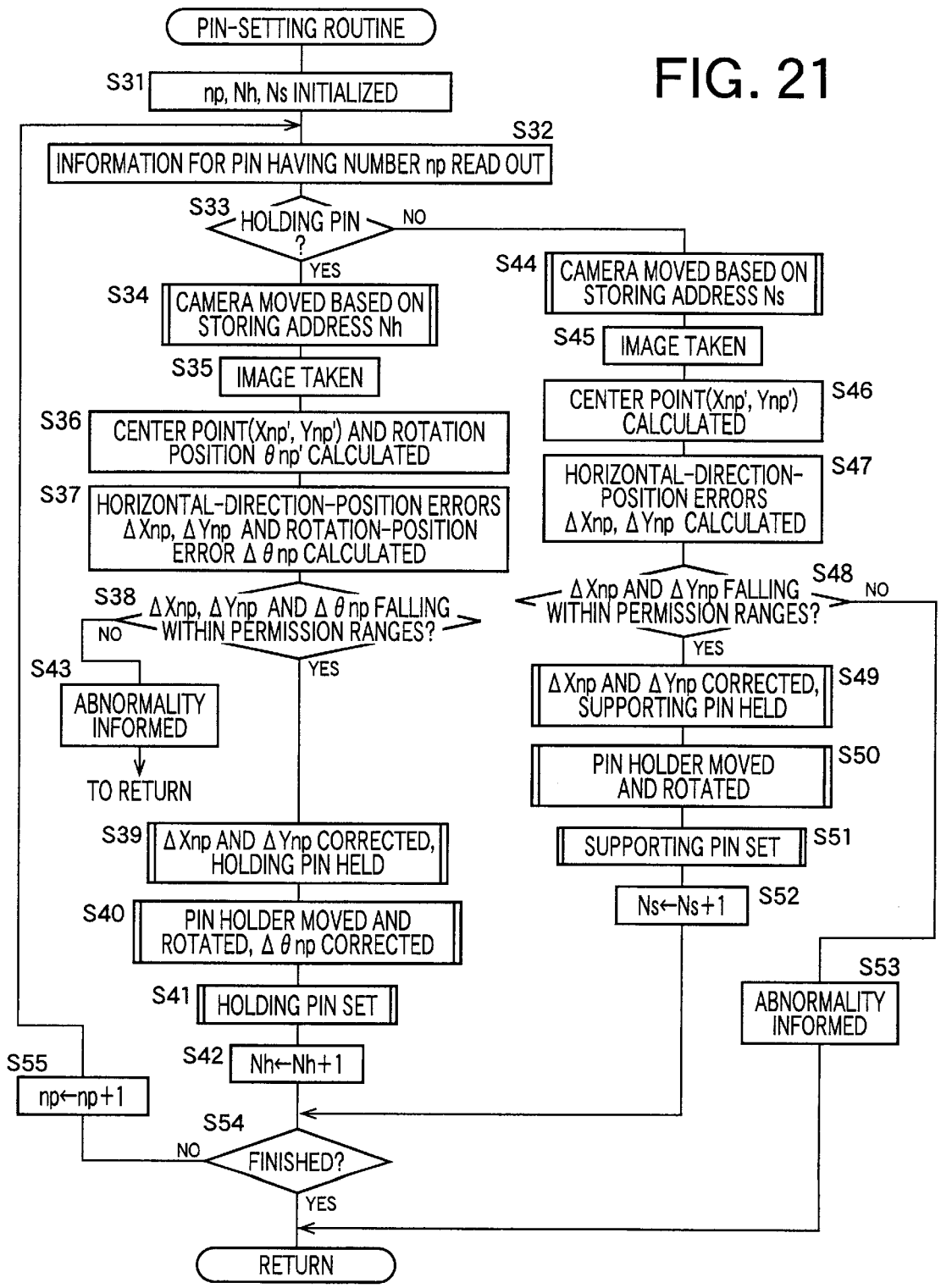
FIG. 21 is a flow chart representing a pin-setting routine according to which the control device operates for setting the holding pins and the supporting pins on the holding table.

A PWB-holding-device resetting operation is automatically performed according to the pin-storing routine and the pin-setting routine shown in FIGS. 20 and 21 and based on the pin-setting information and the pin-storing information to set or store the holding pins 212 and the supporting pins 214. The resetting operation includes detaching all the holding pins 212 and the supporting pins 124 currently set the holding table 210 and storing the detached pins 212, 214 in the storing device 340, and setting the holding pins 212 and the supporting pins 214 at respective appropriate positions on the holding table 210 where the pins 212, 214 cooperate with one another to support a new sort of PWB 24 on which ECs 32 are to be mounted.

The current group of holding pins 212 and supporting pins 214 which are currently set on the holding table 210 are reset from the table 210, according to the current pin-setting information, and a new group of holding pins 212 and supporting pins 214 are set on the table 210, according to new pin-setting information which is prescribed to set the PWB holding device 174 so that the holding device 174 holds a new sort of PWB 24 on which ECs 32 are to be mounted next. The current pin-setting information for the holding pins 212 and supporting pins 214 currently set on the holding table 210 is stored in the RAM 506. The new pin-setting information for the holding pins 212 and supporting pins 214 to support the new sort of PWB 24 may be supplied to the control device 500 in any one of the above-described various manners. Anyhow, when the resetting operation is started, the pin-setting information has been stored in the RAM 506. In addition, the pin-storing information has been input by the operator and stored in the RAM 506. When the supplying of electric power to the present EC mounting system 12 is stopped, the pin-setting information and the pin-storing information are transferred to, and stored in, the external memory device 536; and when the supplying of electric power to the EC mounting system 12 is started, the same information is transferred to, and stored in, the RAM 506. The external memory device 536 is provided with a backup power source which allows the device 536 to keep intact the information stored therein when the supplying of power to the system 12 is stopped.

In the present embodiment, a resetting operation is started in response to a command of an operator or the host computer 530. The operator can operate the operation keys of the input device 544 to command a commencement of the resetting operation. The host computer 530 can supply a remote command to the control device 500 via the communication line 532 to commence the resetting operation. In either case, when the computer 510 receives the resetting-commencement command, the computer 510 carries out the pin-storing routine and the pin-setting routine so that the servo system 560 and others are operated to perform the resetting operation. The computer 510 supplies, to the servo system 560, a destination of movement of the X-Y robot 48, and a position-information-supply request. The servo system 560 supplies, to the computer 510, position information and a finish-of-movement report. When the computer 510 receives a resetting-commencement command, the computer 510 successively carries out both the pin-storing routine and the pin-setting routine, in a normal case. However, in a special case where only the storing, or only the setting, of the holding pins 212 and the supporting pins 214 is commanded, the computer 510 operates for performing only the storing or only the setting according to that command. The resetting of the PWB holding device 174 is performed in a state in which the holding device 174 is positioned at its downward-movement-end position, the PWB 24 has been carried, by the PWB conveyor 22, out of the holding device 174, and a vacant space is present above the holding device 174. In addition, for the resetting operation, the movable guide 190 is moved away from the fixed guide 188, so that a maximal distance is present between the two guides 188, 190.

The storing and resetting of the holding pins 212 and the supporting pins 214 according to the pin-storing routine and the pin-setting routine are briefly described below.

In a resetting operation, after all the holding pins 212 and all the supporting pins 214 currently attached to the holding table 210 are detached and returned to the storing device 340, the holding pins 212 and the supporting pins 124 are re-attached to the holding table 210. The detaching of the holding and supporting pins 212, 214 is performed according to the pin-setting information and the pin-storing information. The holding and supporting pins 212, 124 currently attached to the holding table 210 are detached from the holding table 210, in an order reverse to the order in which those pins 212, 214 had been attached to the same 210. When each holding or supporting pin 212, 214 is stored, an image of the support surface 288, 333 of the each pin 212, 124 is taken by the CCD camera 56. Based on the taken image, respective actual horizontal-direction positions of the each pin 212, 124 in the X-axis and Y-axis directions on a horizontal plane are calculated by the computer 510, and respective errors of the actual horizontal-direction positions of the each pin 212, 124 from respective nominal horizontal-direction positions thereof are determined. If at least one of the thus determined horizontal-direction-positional errors is greater than a prescribed amount, the informing device 556 informs the operator of occurrence of an abnormality. For each holding pin 212, additionally, an actual rotation position of the each pin 212 is calculated based on the image of the fiducial line 298, and an error of the actual rotation position of the each pin 212 from a nominal rotation position thereof is determined. If the rotation-positional error is greater than a prescribed amount, the informing device 556 informs the operator of occurrence of an abnormality. On the other hand, if each of the horizontal-direction-positional errors and the rotation-positional error of each pin 212, 214 is not greater than the corresponding prescribed amount, then the pin holder 368 is stopped at a position which has been corrected based on the horizontal-direction-positional errors, so that the pin holder 368 grasps the each pin 212, 214, detaches and conveys the same, and finally stores the same in the storing device 340. When the pin holder 368 holds each holding pin 212, the holder 368 is positioned at the same rotation position as the current rotation position of the each pin 212; and when the holder 368 holds each supporting pin 214, the holder 368 is positioned at a prescribed rotation position. When the pin holder 368 stores each holding pin 212 in the storing device 340, the holder 368 positions the each pin 212 to a prescribed storage rotation position; and when the holder 368 stores each supporting pin 214 in the storing device 340, the holder 368 positions itself to a prescribed rotation position.

When a resetting command is present, after all the current holding and supporting pins 212, 214 are stored in the storing device 340, the computer 510 carries out the pin-setting routine to set a new group of holding and supporting pins 212, 214 to support a new sort of PWB 24. Before each of the new holding and supporting pins 212, 214 is taken out of the storing device 340, an image of the support surface 288, 333 of the each pin 212, 214 is taken by the CCD camera 56 and, based on the taken image, respective actual horizontal-direction positions of the each pin 212, 124 in the X-axis and Y-axis directions on the horizontal plane, and an actual rotation position of each holding pin 212 are calculated by the computer 510, and respective errors of the actual horizontal-direction positions of the each pin 212, 124 from respective nominal horizontal-direction positions thereof and an error of the actual rotation position of the each holding pin 212 from a nominal rotation position thereof are determined. If at least one of the thus determined horizontal-direction-positional errors and rotation-positional error is greater than a corresponding prescribed amount, the informing device 556 informs the operator of occurrence of an abnormality. On the other hand, if each of the horizontal-direction-positional errors and the rotation-positional error of each pin 212, 214 is not greater than the corresponding prescribed amount, then the pin holder 368 is moved to, and stopped at, a position which has been corrected based on the horizontal-direction-positional errors, so that the pin holder 368 grasps the each pin 212, 214. When the pin holder 368 grasps each pin 212, 214, the holder 368 is positioned at a prescribed rotation position. Then, the pin holder 368 is moved toward the holding table 210, according to the pin-setting information, to set the each pin 212, 214 on the table 210. For each holding pin 212, the pin holder 368 is rotated to correct the rotation-positional error of the each pin 212, so that the each pin 212 is set at a prescribed rotation position thereof on the holding table 210. For each supporting pin 214, the pin holder 368 is rotated to a prescribed rotation position thereof, to prevent the two grasping fingers 370 from interfering with the holding or supporting pins 212, 214 adjacent to the each supporting pin 214.

Next, there will be described in detail the storing and setting of the holding pins 212 and the supporting pins 214 according to the pin-storing routine and the pin-setting routine shown in FIGS. 20 and 21.

If a PWB-holding-device resetting command is received by the computer 510, first, the pin-storing routine is carried out by the same 510. At Step S1 (hereinafter, simply referred to as S1; this applies to the other steps), a pin number np, a holding-pin-storing address Nh, and a supporting-pin-storing address Ns are initialized by the computer 510. In the present embodiment, the holding and supporting pins 212, 214 which are attached to the holding table 210 are detached from the table 210 in an order reverse to an order in which those holding and supporting pins 212, 214 are attached to the table 210, and are stored in the storing device 340 in an order reverse to an order in which those holding and supporting pins 212, 214 are taken out. The order in which the holding and supporting pins 212, 214 are taken out is predetermined such that the pins 212, 214 stored at the nearer storing positions to the PWB holding device 174 (i.e., the storing positions having the smaller addresses) are earlier taken out. Therefore, the pins 212, 214 set on the holding table 210 at the nearer setting positions to the storing device 340 are earlier detached, and are earlier stored in the storing device 340 at the remoter storing positions from the holding table 210 (i.e., the storing positions having the greater addresses). At S1, np, Nh, and Ns are initialized to $np_{max}$, $Nh_{max}$, and $NS_{max}$, respectively. The symbol, $np_{max}$, means the total number of pins 212, 214 currently set on the holding table 210, and is obtained from the current pin-setting information. The symbol, $Nh_{max}$, means the greater one of the greater and smaller pin-storing addresses which cooperate with each other to define a current pin-storing range in the holding-pin storing area 342, and is obtained from the pin-setting information; and the symbol, $Ns_{max}$, means the greater one of the greater and smaller pin-storing addresses which cooperate with each other to define a current pin-storing range in the supporting-pin storing area 344, and is obtained from the pin-setting information.

Next, at S2, information relating the pin having the pin number np is obtained from the pin-setting information. The different sorts of pins are currently attached to the holding table 210. If the pin having the pin number $np_{max}$ is a suction-type or holding pin 212, information relating to the holding pin 212 having the pin number np, i.e., data representing that the pin is a suction-type holding pin 212, a horizontal-direction-position coordinates (Xnp, Ynp) representing a setting position where the holding pin 212 is to be set on the holding table 210, and a rotation position θnp are read out from the RAM 506. Meanwhile, if the pin having the pin number np is a non-suction-type or supporting pin 214, information relating to the supporting pin 214 having the pin number np, i.e., data representing that the pin is a non-suction-type supporting pin 214, a horizontal-direction-position coordinates (Xnp, Ynp) representing a setting position where the supporting pin 214 is to be set on the holding table 210, and a rotation position θnp to which the pin holder 368 is to be rotated when holding the pin 214 to store the same 214 are read out from the RAM 506.

Then, at S3, it is judged whether the pin having the pin number np is a holding pin 212, based on the information read out at S2. If the current pin is a holding pin 212, a positive judgment is made at S3, and the control goes to S4 where, based on the horizontal-direction-position data representing the current horizontal-direction position of the holding pin 212, the holding unit 360 is moved by the X-Y robot 48, so that the pin holder 368 can hold the holding pin 212. However, before the pin holder 368 holds the holding pin 212, an image of the support surface 288 of the pin 212 is taken by the CCD camera 56. Since the CCD camera 56 is mounted together with the holding unit 360 on the Y-axis table 42, the camera 56 is moved with the unit 360. To this end, the X-Y robot 48 is controlled so that the axis line of the pin holder 368 (i.e., the axis line of the air cylinder 394) is positioned at prescribed X and Y coordinates as the horizontal-direction position of the holding pin 212. Therefore, at S4, the holding unit 360 is moved to X and Y coordinates which have been modified by correcting the prescribed X and Y coordinates by respective offset amounts between the axis line of the pin holder 368 and the optical axis of the CCD camera 56. Consequently the optical axis of the CCD camera 56 is positioned at the prescribed X and Y coordinates where the camera 56 is positioned right above the support surface 288 of the holding pin 212.

Since the pin to be stored is a holding pin 212, the pin holder 368 of the holding head 362 is rotated, at S4, by the rotating device 364 while the CCD camera 56 is moved. The pin holder 368 is rotated according to the rotation position θnp read out at S2, so that the rotation position of the direction in which the two grasping fingers 370 are opposed to each other coincides with the rotation position θnp, i.e., that direction is parallel to the lengthwise direction of the seat member 320 of the holding pin 212.

After the movement of the CCD camera 56, the control goes to S5 where an image of the support surface 288 is taken, and respective images of the fiducial mark 294 and the fiducial line 298 are obtained. S5 is followed by S6 where, based on the image of the fiducial mark 294 obtained from the image taken by the CCD camera 56, X and Y coordinates (Xnp', Ynp') of the center point of the support surface 288 are calculated by a known technique and, based on the image of the fiducial line 298, a rotation position θnp' of the holding pin 212 is calculated by a known technique. The calculation of X and Y coordinates (Xnp', Ynp') of the center point of the support surface 288 is carried out by taking the offset amounts between the axis line of the pin holder 368 and the optical axis of the CCD camera 56 into consideration. Then, at S7, horizontal-direction-position errors ΔXnp, ΔYnp of the center point as respective X-axis-direction and Y-axis-direction (i.e., horizontal-direction) positional errors thereof, and a rotation-position error Δθnp as a rotation-direction positional error thereof are calculated. The horizontal-direction-position errors ΔXnp, ΔYnp may be obtained by subtracting, from the calculated X and Y coordinates (Xnp', Ynp'), X and Y coordinates (Xnp, Ynp) as horizontal positions prescribed for the holding pin 212. The thus obtained errors ΔXnp, ΔYnp, each having a plus or minus sign, are stored in the RAM 506. The rotation-position error Δθnp is an angular error which may be obtained by subtracting, from a rotation angle representing the calculated rotation position θnp', a rotation angle representing a rotation position θnp prescribed for the holding pin 212. The rotation-position error Δθnp, having a plus or minus sign, is also stored in the RAM 506.

Next, at S8, it is judged whether the horizontal-direction-position errors ΔXnp, ΔYnp and the rotation-position error Δθnp fall within respective permission ranges. This judgment may be made by comparing respective absolute values of the errors ΔXnp, ΔYnp, Δθnp with respective reference values. If at least one of the respective absolute values of the errors ΔXnp, ΔYnp, Δθnp is greater than a corresponding one of the respective reference values, an abnormality is identified, and a negative judgment is made at S8. In this case, the control goes to S12 where the informing device 556 informs the operator of the occurrence of abnormality. The current resetting operation is interrupted. On the other hand, if each of the respective absolute values of the errors $\Delta Xnp$, $\Delta Ynp$, $\Delta\theta np$ is not greater than the corresponding one of the respective reference values, a positive judgment is made at S8, and the control goes to S9 where the pin holder 368 holds the holding pin 212.

When the holding pin 212 is held, first, the holding unit 360 is moved by the X-Y robot 48 according to the horizontal-position data for the holding pin 212, so that the pin holder 368 is positioned above the pin 286 of the holding pin 212. The positions to which the unit 360 is moved are corrected based on the horizontal-direction errors $\Delta Xnp$, $\Delta Ynp$ calculated at S7, so that the axis line of the pin holder 368 coincides with the axis line of the pin 286. Thus, even if the holding pin 212 may have the horizontal-direction errors $\Delta Xnp$, $\Delta Ynp$, the pin holder 368 can accurately hold the pin 212.

After the holding unit 360 is moved, the holding head 362 is moved downward by the elevating and lowering device 366, so that the pin holder 368 is moved downward. When the pin holder 368 is lowered, the two grasping fingers 370 are kept opened and, in a state in which the pin holder 368 is positioned at its downward-movement-end position, the two grasping fingers 370 are positioned on both sides of the neck portion 300 of the holding pin 212, as indicated at two-dot chain line in FIG. 7. After the pin holder 368 is lowered, the two grasping fingers 370 are closed, so that the engaging portions 444 enter the circular groove 302 and the inclined surfaces 448 engage the side surfaces 304. Thus, the pin holder 368 holds the holding pin 212.

As described previously, the pin holder 368 is rotated while the CCD camera 56 is moved to the position right above the holding pin 212, so that the direction in which the two grasping fingers 370 are arranged is parallel to the lengthwise direction of the seat member 320. Therefore, when the pin holder 368 is lowered to hold the holding pin 212, the two grasping fingers 370 are aligned with the seat member 320 in a direction parallel to the widthwise direction of the holding pin 212. Thus, the grasping fingers 370 are prevented from interfering with the holding and/or supporting pins 212, 214 adjacent to the holding pin 212. That is, when the pin holder 368 holds the holding pin 212, the pin holder 368 is rotated to the rotation position prescribed for the pin 212. Even if the holding pin 212 may have the rotation-position error $\Delta\theta np$, the grasping pins 370 are not largely deviated from the seat member 320 and do not interfere with the adjacent holding and/or supporting pins 212, 214, when the error $\Delta\theta np$ falls within the corresponding permission range and allows a positive judgment to be made at S8. However, when the pin holder 368 holds the holding pin 212, the rotation position of the holder 368 may be corrected based on the rotation-position error $\Delta\theta np$.

After the two grasping fingers 370 grasp the holding pin 212, the elevator table 378 is elevated to move the pin holder 368 upward, so that the holding pin 212 is separated from the holding table 210 against the magnetic force exerted thereto and is lifted up. The respective engaging portions 444 of the two grasping fingers 370 enter the circular groove 302, and the respective inclined surfaces 448 engage the respective side surfaces 304. Thus, the elongate holding pin 212 is held by the pin holder 368 such that the holding pin 212 is not inclined even in the state in which the pin 212 is separate from the holding table 210.

Next, at S10, the pin holder 368 is moved to transfer the holding pin 212 to the storing device 340 and store the same at the prescribed pin-storing position having the address Nh in the holding-pin storing area 342. The pin-storing address Nh is associated with X and Y coordinates corresponding to the prescribed pin-storing position. The pin holder 368 is moved to the X and Y coordinates. During the pin holder 368 is thus moved, the pin holder 368 is rotated to change the rotation position of the holding pin 212 to a rotation position at which the holding pin 212 is to be stored in the storing device 340, e.g., a rotation position at which the seat member 320 extends parallel to the X-axis direction. Since the rotation-position error $\Delta\theta np$ of the holding pin 212 has been calculated based on the image taken by the CCD camera 56, the pin holder 368 is rotated based on the rotation position $\theta np$ at which the holding pin 212 had been set on the holding table 210, the rotation-position error $\Delta\theta np$, and the rotation position at which the holding pin 212 is to be stored, so that the seat member 320 of the holding pin 212 extends parallel to the X-axis direction.

After the pin holder 368 is moved to the pin-storing position having the address Nh, the pin holder 368 is lowered to its downward-movement-end position where the holding pin 212 is stored in the storing device 340. Since the height position of the support surface of the storing device 340 that supports the seat surface of the holding pin 212 is equal to that of the holding surface 244 of the holding table 210 of the PWB holding device 174 being positioned at its downward-movement-end position, the seat member 320 of the holding poin 212 fits, when the pin holder 368 is lowered, in one recess formed in the support surface of the storing device 340, so that the holding pin 212 is stored in the storing device 340 such that the seat surface of the holding pin 212 is supported by the support surface. After the pin holder 368 is lowered, the two grasping fingers 370 are opened to release the holding pin 212. After the pin holder 368 releases the holding pin 212, the pin holder 368 is moved upward.

After the holding pin 212 is stored, the control goes to S11 where the holding-pin storing address Nh is decreased by one and then, the control goes to S22 to judge whether the current pin-storing operation has been finished, i.e., whether all the holding and supporting pins 212, 214 set on the holding table 210 have been stored in the storing device 340. This judgment is made by, e.g., judging whether the pin number np is equal to one. This judgment is negative till all the holding and supporting pins 212, 214 are stored in the storing device 340, and the control goes to S23 to decrease the pin number np by one, and then goes back to S2.

If the next pin having the next number np is a non-suction-type supporting pin 214, a negative judgment is made at S3, and the control goes to S13 and the following steps. It does not matter with the rotation position of each supporting pin 214 itself, and the supporting pin 214 is not associated with a rotation position $\theta$. Therefore, each supporting pin 214 is stored like each holding pin 212 is stored, except that for the supporting pin 214, no actions are taken in connection with rotation positions. More specifically described, at S13, when the CCD camera 56 is moved to a position right above the supporting pin 214, the pin holder 368 is rotated to a rotation position at which the pin holder 368 is to store the supporting pin 214, that is, a rotation position, represented by the pin-setting information, at which the two grasping fingers 370 do not interfere, when being opened and closed, with the holding and/or supporting pins 212, 214 adjacent to the supporting pin 214. Then, at S14, only an image of the fiducial mark present in the support surface 333 is taken and, at S15, X and Y coordinates (Xnp', Ynp') of a center point of the support surface 333 are calculated. Then, at S16, horizontal-direction-position errors $\Delta Xnp$, $\Delta Ynp$ are calculated and, at S17, it is judged whether the horizontaldirection-position errors $\Delta Xnp$, $\Delta Ynp$ fall within respective permission ranges. If at least one of the errors $\Delta Xnp$, $\Delta Ynp$ does not fall within a corresponding one of the permission ranges, a negative judgment is made at S17, and the control goes to S21 where the operator is informed of the occurrence of abnormality.

If each of the horizontal-direction-position errors $\Delta Xnp$, $\Delta Ynp$ falls within the corresponding one of the permission ranges, a positive judgment is made at S17, and the control goes to S18 where the positions at which the pin holder 368 is to be stopped are modified based on the errors $\Delta Xnp$, $\Delta Ynp$. Then, the pin holder 368 is moved to a position right above the supporting pin 214, holds the pin 214, and lifts up the same 214 from the holding table 210. Subsequently, at S19, the pin holder 368 is moved to store the supporting pin 214 at the position having the supporting-pin storing address Ns in the supporting-pin storing area 344. During this movement, the pin holder 368 is rotated so that the direction in which the two grasping fingers 370 are arranged is parallel to the X-axis direction. Thus, the pin holder 368 stores the supporting pin 214 in the supporting-pin storing area 344, without interfering with the supporting pins 214 stored in the addresses adjacent to the address Ns. Then, at S20, the supporting-pin storing address Ns is decremented by one. S2 to S11, S13 to S20, S22, and S23 are repeated till all the holding and supporting pins 212, 214 are returned to the storing device 340.

If all the holding and supporting pins 212, 214 have been returned to the storing device 340, a positive judgment is made at S22, and the pin-storing routine is finished. Then, the computer 510 carries out the pin-setting routine to set the holding pins 212 and the supporting pins 214 on the holding table 210. At S31 of the pin-setting routine, the pin number np, the holding-pin storing address Nh, and the supporting-pin storing address Ns are initialized. More specifically described, the pin number np is initialized to one, and the two addresses Nh, Ns are initialized to the respective smaller ones of the respective greater and smaller addresses defining the respective address ranges in which the holding pins 212 and the supporting pins 214 are stored in the holding-pin storing area 342 and the supporting-pin storing area 344, respectively. Thus, the pins 212, 214 stored at the nearer addresses in the storing areas 342, 344 to the PWB holding device 174 are earlier taken out of the storing device 340. Then, at S32, information relating the pin having the pin number np is obtained from the pin-setting information. Next, at S33, it is judged whether the pin having the pin number np is a holding pin 212. If the current pin is a holding pin 212, a positive judgment is made at S33, and the control goes to S34 where the CCD camera 56 is moved to the storing position having the holding-pin storing address Nh. After the movement of the CCD camera 56, the control goes to S35 where an image of the support surface 288 of the holding pin 212 is taken by the camera 56.

Then, at S36, based on the image of the fiducial mark 294 obtained from the image taken by the CCD camera 56, X and Y coordinates (Xnp', Ynp') of the center point of the support surface 288 are calculated and, based on the image of the fiducial line 298, a rotation position $\theta np'$ of the holding pin 212 is calculated. After those calculations, the control goes to S7 where horizontal-direction-position errors $\Delta Xnp$, $\Delta Ynp$ and a rotation-position error $\Delta\theta np$ of the holding pin 212 are calculated. Next, at S38, it is judged whether the horizontal-direction-position errors $\Delta Xnp$, $\Delta Ynp$ and the rotation-position error $\Delta\theta np$ fall within the respective permission ranges, like at S8. If at least one of the errors $\Delta Xnp$, $\Delta Ynp$, $\Delta\theta np$ does not fall within a corresponding one of the respective permission ranges, a negative judgment is made at S38. In this case, the control goes to S43 where the informing device 556 informs the operator of the occurrence of abnormality. The current resetting operation is interrupted.

On the other hand, if each of the respective errors $\Delta Xnp$, $\Delta Ynp$, $\Delta\theta np$ falls within the corresponding one of the permission ranges, a positive judgment is made at S38, and the control goes to S39 where the pin holder 368 is moved to a position right above the pin 286 of the holding pin 212 to hold the holding pin 212. To this end, prescribed horizontal-direction-position coordinates (Xnh, Ynh) corresponding to the holding-pin storing address Nh are modified based on the horizontal-direction-position errors $\Delta Xnp$, $\Delta Ynp$, and the pin holder 368 is moved to the thus modified horizontal-direction-position coordinates. Therefore, the axis line of the pin holder 368 coincides with the axis line of the pin 286, even if the holding pin 212 may have some horizontal-direction-position errors. Thus, the pin holder 368 can accurately hold the holding pin 212. When the pin holder 368 takes each holding pin 212 out of the storing device 340, the pin holder 368 is rotated to a prescribed rotation position, e.g., a rotation position at which the direction of arrangement of the two grasping fingers 370 is parallel to the X-axis direction. Thus, the pin holder 368 is prevented from interfering with the holding pins 212 stored at the addresses adjacent to the address Nh. The rotation of the pin holder 368 to the prescribed rotation position is finished before the pin holder 368 holds the holding pin 212. After the movement of the pin holder 368, the pin holder 368 is lowered and then the two grasping fingers 370 are opened to grasp the holding pin 212. After the fingers 370 grasp the holding pin 212, the pin holder 368 is elevated so that the holding pin 212 is taken out of the storing device 340.

Then, at S40, the pin holder 368 is moved to the holding table 210 according to the setting-position data representing the setting position where the holding pin 212 is to be set. Since the holding pin 212 is a suction-type pin which has a prescribed rotation position $\theta np$, the pin holder 368 is rotated during this movement. This rotation is effected based on the rotation position $\theta np$ prescribed for the holding pin 212, and the rotation-position error $\Delta\theta np$ obtained from the image taken by the CCD camera 56 when the holding pin 212 is taken out of the storing device 340. Thus, the rotation-position error $\Delta\theta np$ is corrected so that the holding pin 212 may be set at the prescribed rotation position $\theta np$ on the holding table 210.

After the movement of the pin holder 368, the control goes to S41 to lower the pin holder 368 and set the holding pin 212 on the holding table 210. More specifically described, the seat surface 329 of the seat member 320 of the holding pin 212 is held in close contact with the holding surface 244 of the holding table 210, such that the seat surface 329 surrounds the plurality of communication holes 240, i.e., the opening of the negative-pressure-supply hole 224. After the holding pin 212 is set, the two grasping fingers 370 are opened to release the holding pin 212, and then the pin holder 368 is elevated.

The seat member 320 of the holding pin 212 set on the holding table 210 is held in close contact with the holding surface 244, such that the seat member 320 surrounds the opening of the valve hole 226. As previously described, owing to a magnetic force, the holding pin 212 is attracted and fixed to the holding table 210. In addition, owing to a magnetic force, the ball 268 is moved away from the valve seat 262, and the opening and closing valve 260 is opened. Since the permanent magnets 328 are elongate, the magnets 328 may be safely aligned with the ball 268 even if the pin 286 of the holding pin 212 set on the holding table 210 may not be aligned with the supply hole 224. Thus, the ball 268 is attracted owing to the magnetic force to the holding pi n 212, and is moved away from the valve seat 262.

After the holding pin 212 is set on the holding table 210, the control goes to S42 where the holding-pin storing address Nh is incremented by one and then, the control goes to S54 to judge whether all the holding and supporting pins 212, 214 have been set on the holding table 210. This judgment is made by, e.g., judging whether the pin number np is equal to the total pin number $np_{max}$. The judgment at S54 is negative till all the holding and supporting pins 212, 214 are set on the holding table 210, and the control goes to S55 to increment the pin number np by one, and then goes back to S32.

If the next pin having the next number np is a non-suction-type supporting pin 214, a negative judgment is made at S33, and the control goes to S44 and the following steps. It does not matter with the rotation position of each supporting pin 214 itself. Therefore, each supporting pin 214 is set on the holding table 210 like each holding pin 212 is set, except that for the supporting pin 214, no actions are taken in connection with rotation position θnp or rotation-position error Δθnp. More specifically described, when the pin holder 368 grasps each supporting pin 124 stored in the supporting-pin storing area 344, the pin holder 368 is rotated to a prescribed rotation position at which the direction of arrangement of the two grasping fingers 370 is parallel to the X-axis direction. Thus, the pin holder 368 can grasp each supporting pin 214, without interfering the supporting pins 212, 214 adjacent thereto. Then, while the pin holder 368 holding each supporting pin 214 is moved to the prescribed setting position on the holding table 210, the pin holder 368 is rotated according to the rotation-position data representing the prescribed rotation position at which the two grasping fingers 370 are opposed to each other in a prescribed direction which assures that the fingers 370 can set each supporting pin 214 on the holding table 210, without interfering with the holding and/or supporting pins 212, 214 already set adjacent thereto. S32 to S42, S44 to S52, S54, and S55 are repeated till all the holding and supporting pins 212, 214 are set on the holding table 210. If all the programmed holding and supporting pins 212, 214 are set on the holding table 210, a positive judgment is made at S54, and this routine is finished.

As is apparent from the foregoing description of the present embodiment, the PWB holding device 174 can be automatically reset without needing any interventions of the operator. Therefore, the holding device 174 can be reset at an improved speed, i.e., more quickly. In addition, in some of the negative-pressure-supply holes 224 to which the holding pins 212 are attached, the corresponding opening and closing valves 260 are opened; and the other, remaining negative-pressure-supply holes 224 to which no holding pins 212 are attached, the corresponding opening and closing valves 260 remain closed. Therefore, it is not needed to employ caps or the like to close the remaining holes 224 to prevent the leakage of negative-pressure air. Thus, it is just needed to place the holding pins 212 and the supporting pins 214 on the holding table 210, in order that the PWB holding device 174 which supports the desired portions of the PWB 24 at the desired distance from the holding table 210 may be easily and quickly obtained. Since the PWB holding device 174 can be reset in a short time, the EC mounting system 12 can be operated at an improved efficiency. Moreover, when each of the holding pins 212 and the supporting pins 214 is set on the holding table 210, the pin holder 368 is mechanically moved by the X-Y robot 48 according to the setting-position data prepared in advance for the each pin 212, 214. In contrast, in the case where the holding and supporting pins 212, 214 are set on the holding table 210 by different operators, the pins 212, 214 may be set at different positions owing to respective individualities of the different operators. That is, since in the present embodiment the holding and supporting pins 212, 214 are accurately set at the prescribed positions, the quality of the PWB holding device 174 is improved. Furthermore, since the resetting operation is automated, the time needed for the operator to intervene in the resetting operation is minimized. Thus, the efficiency of the resetting operation is improved, and the frequency of occurrence of errors resulting from the operator's interventions is minimized. In addition, since the resetting apparatus shares the X-Y robot 48 with the EC mounting device 16, the resetting apparatus can be produced at reduced cost, and the EC mounting system 12 can enjoy a simplified construction.

As is apparent from the foregoing description of the present embodiment, the Y-axis table 42 provides a movable member; the X-Y robot 48 and the elevating and lowering device 52 cooperate with each other to provide an operation-relating moving device; and the X-Y robot 48 and the elevating and lowering device 366 cooperate with each other to provide a resetting-relating moving device. The elevating and lowering device 52 elevates and lowers the EC mounting head 30 relative to the PWB holding device 174 holding the PWB 24, in directions perpendicular to the supporting surface 244 as a surface of the holding table 210; and the elevating and lowering device 366 elevates and lowers the holding head 362 relative to the holding table 210 and the support table of the storing device 340, in directions perpendicular to the supporting surface 244 and the support surface of the support table of the storing device 340. The X-Y robot 48 moves the holding head 362 relative to the storing device 340 and the holding table 210, in directions parallel to the supporting surface 244 as the surface of the holding table 210, on one hand, and moves, on the other hand, the EC mounting head 30 relative to the PWB holding device 174 in directions parallel to the supporting surface 244 of the holding table 210. Thus, the above-indicated two moving devices share the X-Y robot 48.

A portion of the computer 510 that transfers the control information from the external memory device 536 to the RAM 506 provides an information transferring means; and the external memory device 536 and the RAM 506 cooperate with each other to provide a control-information memory. A portion of the computer 510 that carries out the pin-storing routine and the pin-setting routine based on the pin-setting information and the pin-storing information, provides an information processor; a portion of the computer 510 that starts the pin-storing routine and the pin-setting routine based on the start command supplied from the host computer 530, provides a first starting means; and a portion of the computer 510 that starts the pin-storing routine and the pin-setting routine based on the start command input by the operator, provides a second starting means. Moreover, a portion of the computer 510 that stores, in the external memory device 536, the pin-setting information or the like supplied from the host computer 530, provides a first storing means; a portion of the computer 510 that stores, in the external memory device 536, the pin-setting information or the like read by the reading device 540, provides a second storing means; and a portion of the computer 510 that stores, in the RAM 506, the pin-setting information or the like input by the operator through the input device 544, provides a third storing means. The CCD camera 56 provides a supporting-member recognizing device or a mark recognizing device, or an image taking device as a sort of recognizing device. Moreover, a portion of the computer 510 that carries out S12, S21, S43, and S53 provides an informing control portion; a portion of the computer 510 that carries out S4, S10, S13, S19, S34, S40, S44, and S50 provides a moving control portion; a portion of the computer 510 that carries out S9, S18, S39, and S49 provides a stop-position correcting portion; and the informing control portion, the moving control portion, and the stop-position correcting portion cooperate with one another to provide a free-end-portion-relating-information-dependent control portion. In addition, respective portions of the computer 510 and the servo system 560 that control the X-Y robot 48 when the ECs 32 are mounted on the PWB 24, provide an operation-relating control portion. The control device 500 provides a setting control device which controls setting the pins 212, 214 on the holding table 210, and provides a storing control device which controls storing the pins 212, 214 in the storing device 340.

In the illustrated embodiment, the transmission of the manufacturing program from the host computer 530 to the computer 510 is effected in response to the operator's operation of the host computer 530. However, the transmission may be effected in response to a request of the computer 510 to the host computer 530.

In the illustrated embodiment, the servo system 560 includes the computer 562. However, the servo system 560 may be provided by only logic circuits which output interruption signals and others.

In the illustrated embodiment, when each holding pin 212 is stored, it is judged, at S8, whether the rotation-position error Δθnp of the pin 212 falls within the permission range, before the pin 212 is grasped; and when each holding pin 212 is set, it is judged, at S38, whether the rotation-position error Δθnp of the pin 212 falls within the permission range, before the pin 212 is grasped. However, at least one of those two steps may be omitted.

In the illustrated embodiment, the holding and supporting pins 212, 214 are magnetically fixed to the holding table 210, and the permanent magnets 328, 338 of the pins 212, 214 and the coming-off preventing plate 216 formed of ferromagnetic material cooperate with each other to provide a fixing device. However, the fixing device may be one which fixes the supporting members such as the holding and supporting pins 212, 214, to the supporting table 210, owing to a non-magnetic force. The fixing device may be one which allows the supporting members 212, 214 to be automatically and iteratively attached to, and detached from, the supporting surface 244 of the supporting table 210. Preferably, the fixing device fixes and releases the supporting members 212, 124 to and from the supporting surface 244, by moving at least one of each supporting member and the supporting surface relative to the other in directions perpendicular to the supporting surface, in directions parallel to the supporting surface, and in directions intersecting the supporting surface. For example, the fixing device may be provided by two fastening members, such as so-called magic tapes, which are provided on the supporting surface and the seat surface 329, 339 of each supporting pin 212, 214, respectively, and which engage and fasten each other; or two tacky layers which are provided on the supporting surface and the seat surface 329, 339 of each supporting pin 212, 214, respectively.

In the illustrated embodiment, the pin 286 of each holding pin 212 may be connected to one of the lengthwise opposite end portions of the elongate seat member 320 thereof.

After one or more supporting members 212, 214 is or are set on the supporting table 210, an image of each supporting member 212, 214 may be taken and, based on the taken image, positional errors of the supporting member in directions parallel to the supporting surface 244 may be calculated. If each supporting member is associated with a prescribed rotation position, a rotation-position error of the supporting member may additionally be calculated. The calculated positional errors and/or rotation-position error are compared with respective reference amounts and, if at least one of the errors is greater than a corresponding one of the reference amounts, the occurrence of abnormality is informed. This may be carried out each time one supporting member is set on the supporting surface, or after all the supporting members are set on the supporting surface. Likewise, after one or more supporting members 212, 214 is or are stored in the storing device 340, an image of each supporting member 212, 214 may be taken and, based on the taken image, positional errors of the supporting member in directions parallel to the support surface of the storing device may be calculated. If each supporting member is associated with a prescribed rotation position, a rotation-position error of the supporting member may additionally be calculated. The calculated positional errors and/or rotation-position error are compared with respective reference amounts and, if at least one of the errors is greater than a corresponding one of the reference amounts, the occurrence of abnormality is informed. The reference amounts employed for the supporting members stored in the storing device may be greater than those employed for the supporting members set on the supporting table. That is, the criterion used to find abnormality with the position of each supporting member stored in the storing device may be less strict than that used to find abnormality with the position of each supporting member set on the supporting table.

Respective images of all the supporting members 212, 214 set on the supporting table 210 may be taken before each of the supporting members is detached from the supporting table; and respective images of all the supporting members 212, 214 stored in the storing device 340 may be taken before each of the supporting members is taken out of the storing device.

In the illustrated embodiment, the holding unit 360 and others are provided on the Y-axis table 42 and, when the ECs 32 are mounted on the PWB 24, the holding unit 360 is moved with the suction nozzle 60. However, the holding unit 360 may be modified such that the holding unit 360 is moved by the X-Y robot 48 only when the resetting operation is performed, and such that when the ECs 32 are mounted on the PWB 24, the holding unit 360 waits at a waiting position or shelters to a sheltering position. For example, the holding unit 360 may be provided on a table different from a table on which the EC mounting head 30, the rotating device 50, the elevating and lowering device 52, and others are mounted, and respective connection portions of the two tables may be connected to, and disconnected from, each other. The two tables may additionally include respective air-supply portions which are for supplying a positive-pressure air to the elevating and lowering device 366 and others. In this case, when the respective connection portions of the two tables are connected to each other, the respective air-supply portions of the two tables are simultaneously connected to each other.

The Y-axis table 42 on which the suction nozzle 60 and others are provided is never detached from the X-axis table 36, and a third table on which the holding unit 360 is provided is detached from the X-axis table 36 when the ECs 32 are mounted on the PWB 24, so that the third table waits at the waiting position. The waiting position may be a position adjacent, in the Y-axis direction, to the X-axis table 36 being positioned at its origin position. When the X-axis table 36 is returned to the origin position for the resetting operation, the third table on which the holding unit 360 is provided is connected to the Y-axis table 42 on which the EC mounting head 30 and others are mounted, so that the holding unit 360 is moved by the X-Y robot 48. After the supporting members 212, 214 are set on the holding table 210, the X-axis table 36 is moved to the origin position, so that the third table on which the holding unit 360 is provided is disconnected from the Y-axis table 42 on which the mounting head 30 and others are provided, and waits at the waiting position. The Y-axis table 42 having the thus reduced weight is used for the EC mounting operation.

In the illustrated embodiment, the resetting operation is performed such that first, all the holding and supporting pins 212, 214 currently set on the holding table 210 are all detached from the holding table and then, the holding and supporting pins needed to hold a new sort of PWB are set on the holding table. However, in the case where the positions and phases of some of the current holding and supporting pins are common with those of some of the new holding and supporting pins, those common backup pins may be left on the holding table. In this case, only the other, current holding and supporting pins are detached from the holding table, and only the other, new holding and supporting pins are set on the holding table.

In the illustrated embodiment, the two sorts of supporting pins, that is, the suction-type, holding pins 212 and the non-suction-type, supporting pins 214 are employed to support the PWB 24, and all the pins of each sort have the same size and shape. However, pins of a same sort may have different sizes or shapes. For example, respective contact surfaces 312 of respective suction cups 310, or respective support surfaces 288, of holding pins 212 may have different areas; and respective support surfaces 333 of supporting pins 214 may have different areas. In addition, each of respective seat members 320 of holding pins 212 may have any of different shapes such as an elongate shape or a circular shape. Moreover, it is possible that supporting members whose respective support surfaces have different shapes be employed to support a PWB. For example, as disclosed in Japanese Patent Document 11-204995 and its corresponding U.S. patent application Ser. No. 09/204,311, a support surface of each supporting member may have a shape, such as circular, rectangular, L-shaped, cross-shaped, T-shaped, etc., that matches with a supportable portion of a back surface of a PWB 24. A free end portion of each supporting member that supports a PWB 24 may be formed of rubber. In the illustrated embodiment, all portions of each PWB 24 have a same thickness, and all the holding and supporting pins 212, 214 have a same height. However, in the case where a plurality of portions of each PWB 24 have different thickness values, supporting and holding pins 212, 124 may have different height values (i.e., different distances between seat surfaces thereof and support surfaces thereof), so that appropriate ones of the pins may be selected to support the thickness-different portions of each PWB 24, respectively. Even in the case where height-different pins are employed, respective neck portions of the pins as to-be-grasped portions thereof may have a same height (i.e., distance from seat surfaces thereof), so that each of the height-different pins may be held and set by a same operation of the pin holder 368 (i.e., same-stroke downward and upward movements of the holder 368). The respective shapes and sizes of the supporting members 212, 214 (e.g., the respective areas of the respective support surfaces 288, 333 or respective contact surfaces 312, or the respective heights of the pins 212, 214) may be stored as part of the control information in the control-information memory. In this case, the control information may be utilized when the supporting members are set or stored. For example, a shape of each supporting member to be set is obtained by imaging, the obtained shape is compared with nominal shape data, and it is judged whether the supporting member is a correct one. In the case where various sorts of supporting members 212, 214 are employed to support PWBs 24 in different manners or support PWBs 24 having different shapes or sizes, the storing device 340 may store the different sorts of supporting members in respective different areas, or store the different sorts of supporting members according to a different rule ignoring the sorts of the supporting members. For example, the rule may be such that the shorter supporting members or the less frequently used supporting members are stored in the nearer positions to the PWB holding device 174. Even in the case where different sorts of supporting members 212, 214 are stored in the storing device 340 in a state in which those supporting members are mixed with each other, it is possible to take necessary supporting members out of the storing device and set those supporting members on the supporting table 210 to support a PWB 24, and detach those supporting members from the supporting table and return the same to the storing device, if each of the supporting members is associated with prescribed storing and setting positions.

In the illustrated embodiment, the pin-storing information is input by the operator, and the input information is utilized by the control device 500 to store and set the holding pins 212 and the supporting pins 214. However, the pin-storing information may be dealt with independent of the pin-setting information. For example, the pin-storing information may be exclusively dealt with by a pin-storing control device belonging to the storing device 340. When a certain supporting member 212, 214 set on the supporting table 210 needs to be stored in the storing device 340, a portion of the control device 500 that controls the movement of the holding head 362 of the EC mounting system 12 or the resetting apparatus requests the pin-storing control device to teach the position where the supporting member is to be stored, and stores the supporting member at the taught position. Meanwhile, when a certain supporting member 212, 214 needs to be set on the supporting table 210, the control device 500 requests the pin-storing control device to teach the position where the supporting member is stored in the storing device 340, and takes the supporting member from the taught position to set the same on the supporting table. Thus, the supporting members 212, 214 stored in the storing device 340 are managed by the pin-storing control device, independent of the sorts of the PWBs 24 on which the ECs 32 are mounted. However, it is not needed to physically separate the pin-storing control device from the control device 500 that controls the EC mounting system 12 or the resetting apparatus, that is, the pin-storing control device may be provided by part of the control device 500.

The resetting apparatus may be one which does not share any elements, e.g., the X-Y robot 48, with the EC mounting device 16, i.e., is independent of the EC mounting device 16.

In the illustrated embodiment, the opening and closing valve 260 is provided in each of the negative-pressure-supply holes 224. However, this is not an essential feature. In the case where no opening and closing valves 260 are provided, the respective openings of the negative-pressure-supply holes 224 to which the holding pins 212 are not attached may be closed by respective closure members. The closure members may be automatically attached to, and detached from, the holding table 210, like the holding pins 212. In the latter case, the holding pins 212 and the closure members may have respective permanent magnets and at least the holding surface 244 of the holding table 210 may be formed of a ferromagnetic material, or vice versa. In addition, the respective portions of the holding pins and the closure members that are to be attached to the holding table 210 may be formed of a ferromagnetic material and the support table of the storing device 340 may be formed of a permanent magnet.

In the illustrated embodiment, the PWB clamping device 172 includes the respective clamping plates which are movably provided on the fixed and movable guides 188, 190, and the respective clamping cylinders which move the respective clamping plates toward the PWB hold-down portions 194 so that the clamping plates cooperate with the hold-down portions 194 to clamp the opposite end portions of the PWB 24. However, the clamping plates may be modified such that when the PWB holding device 174 is moved upward, the clamping plates are engaged with the holding table 210; as the holding table is moved upward, the clamping plates are moved toward the PWB hold-down portions 194 against the biasing action of the springs; and finally, the clamping plates cooperate with the hold-down portions 194 to clamp the PWB 24.

The clamping plates of the PWB clamping device 172 may be provided on the holding table. For example, two clamping plates are provided on opposite end portions of the holding table, respectively, that extend parallel to the PWB-convey direction, such that the clamping plates stand upright. Each holding pin 212 should have such a height which assures that an upper end surface thereof is positioned on the same plane as that on which respective upper end surfaces of the clamping plates are positioned. When the PWB holding device 174 is moved upward, the holding pins 212 suck and hold the PWB 24, the clamping plates support the lower surface of the PWB 24, and cooperate with the PWB hold-down portions 194 to sandwich the opposite end portions of the PWB 24. The distance between the two clamping plates may be changed by a width changing device according to a width of the PWB 24. Alternatively, the holding table 210 which has a size corresponding to a size of the current PWB 24 and is provided with a pair of clamping plates whose distance corresponds to the size of the current PWB 24, may be replaced with a new holding table which has a size corresponding to a size of a new sort of PWB 24 and is provided with a pair of clamping plates whose distance corresponds to the size of the new PWB 24.

In the illustrated embodiment, the PWB elevating and lowering device 170 may be one which includes, as its drive source, a pressurized-air-operated cylinder device as a pressurized-fluid-operated actuator.

It is to be understood that the present invention may be embodied with other changes, modifications, and improvements, such as those described in SUMMARY OF THE INVENTION, which may occur to a person skilled in the art without departing from the spirit and scope of the invention defined in the appended claims.

What is claimed is:

1. An apparatus for automatically resetting a printed-wiring-board supporting device including a supporting table and at least one supporting member which is set on a supporting surface of the supporting table to support a back surface of a printed wiring board, the apparatus comprising:

a storing device in which said at least one supporting member is stored;

a holding head which holds the supporting member;

a moving device which moves at least one of the holding head, the supporting table, and the storing device, relative to at least one other of the holding head, the supporting table, and the storing device; and a control device which includes a control-information memory in which prescribed control information is stored, and a computer including an information processor that processes the control information stored in the control-information memory, and which controls, according to the control information, the moving device so that the holding head takes the supporting member from a storing position in the storing device and sets the supporting member at a setting position on the supporting surface of the supporting table, and takes the supporting member from the setting position and stores the supporting member at the storing position, the computer further including at least one of (a) a first starting means for starting, in response to a start command supplied from a host computer, the information processor to process the control information, and (b) a second starting means for starting, in response to a start command input by an operator through an input device, the information processor to process the control information.

2. An apparatus according to claim 1, wherein the supporting member comprises a supporting pin having a seating surface which is supported by the supporting surface of the supporting table, and including a shank portion which extends perpendicularly to the seating surface and which supports, at a free end portion thereof, the printed wiring board, and wherein the holding head comprises a pin holder which holds the supporting pin.

3. An apparatus according to claim 1, wherein the computer includes the first starting means for starting, in response to the start command supplied from the host computer, the information processor to process the control information.

4. An apparatus according to claim 1, wherein the control device includes the input device which is operable by the operator, and wherein the computer further comprises the second starting means for starting, in response to the start command input through the input device, the information processor to process the control information.

5. An apparatus according to claim 1, wherein the computer further comprises a first storing means for storing, in the control-information memory, the control information supplied from a host computer.

6. An apparatus for automatically resetting a printed-wiring-board supporting device including a supporting table and at least one supporting member which is set on a supporting surface of the supporting table to support a back surface of a printed wiring board, the apparatus comprising:

a storing device in which said at least one supporting member is stored;

a holding head which holds the supporting member;

a moving device which moves at least one of the holding head, the supporting table, and the storing device, relative to at least one other of the holding head, the supporting table, and the storing device; and a control device which includes a control-information memory in which prescribed control information is stored, and a computer including an information processor that processes the control information stored in the control-information memory, and which controls, according to the control information, the moving device so that the holding head takes the supporting member from a storing position in the storing device and sets the supporting member at a setting position on the supporting surface of the supporting table, and takes the supporting member from the setting position and stores the supporting member at the storing position, the computer further including at least one of (a) a first starting means for starting, in response to a start command supplied from a host computer, the information processor to process the control information, and (b) a second starting means for starting, in response to a start command input by an operator through an input device, the information processor to process the control information, wherein the control device further comprises a reading device which reads the control information recorded on a portable information-recording medium, and wherein the computer further comprises a second storing means for storing, in the control-information memory, the control information read by the reading device.

7. An apparatus according to claim 1, wherein the control device further comprises an input device which is operable by an operator, and wherein the computer further comprises a third storing means for storing, in the control-information memory, the control information input through the input device.

8. An apparatus according to claim 1, wherein the control-information memory comprises an internal memory which is incorporated by the computer, and an external memory which is provided outside the computer, and wherein the computer further comprises an information transferring means for transferring the control information from one of the internal memory and the external memory to the other of the internal and external memories.

9. An apparatus according to claim 1, wherein the control information comprises information relating to at least one of the setting position, the storing position, a sort of the supporting member, a shape of the supporting member, and a dimension of the supporting member.

10. An apparatus according to claim 1, further comprising a recognizing device which recognizes a free end portion of the supporting member and obtains information relating to the free end portion.

11. An apparatus according to claim 10, wherein the recognizing device comprises an image taking device which takes an image of the free end portion of the supporting member.

12. An apparatus according to claim 10, wherein the moving device moves the recognizing device together with the holding head, relative to the supporting table.

13. An apparatus according to claim 12, wherein the control device comprises a free-end-portion-relating-information-dependent control portion which controls the apparatus, based on the information, obtained by the recognizing device, relating to the free end portion of the supporting member.

14. An apparatus according to claim 13, further comprising an informing device which outputs information recognizable by an operator, and wherein the free-end-portion-relating-information-dependent control portion comprises an informing control portion which operates the informing device when the information obtained by the recognizing device differs from a reference information by not less than a prescribed amount.

15. An apparatus according to claim 13, wherein the free-end-portion-relating-information-dependent control portion comprises a moving control portion which controls the moving device.

16. An apparatus for automatically resetting a printed-wiring-board supporting device including a supporting table and at least one supporting member which is set on a supporting surface of the supporting table to support a back surface of a printed wiring board, the apparatus comprising:

a storing device in which said at least one supporting member is stored;

a holding head which holds the supporting member;

a moving device which moves at least one of the holding head, the supporting table, and the storing device, relative to at least one other of the holding head, the supporting table, and the storing device;

a control device which includes a control-information memory in which prescribed control information is stored, and a computer including an information processor that processes the control information stored in the control-information memory, and which controls, according to the control information, the moving device so that the holding head takes the supporting member from a storing position in the storing device and sets the supporting member at a setting position on the supporting surface of the supporting table, and takes the supporting member from the setting position and stores the supporting member at the storing position, the computer further including at least one of (a) a first starting means for starting, in response to a start command supplied from a host computer, the information processor to process the control information, and (b) a second starting means for starting, in response to a start command input by an operator through an input device, the information processor to process the control information; and a recognizing device which recognizes a free end portion of the supporting member and obtains information relating to the free end portion, the moving device moving the recognizing device together with the holding head, relative to the supporting table, the control device further comprising a free-end-portion-relating-information-dependent control portion which controls the apparatus, based on the information, obtained by the recognizing device, relating to the free end portion of the supporting member, the free-end-portion-relating-information-dependent control portion comprising a moving control portion which controls the moving device, wherein the information obtained by the recognizing device comprises position information representing a position of the free end portion of the supporting member, and wherein the moving control portion comprises a stop-position correcting portion which corrects a stop position where the moving device stops a movement of at least one of (a) the holding head and (b) at least one of the supporting table and the storing device, relative to the other of (a) the holding head and (b) said at least one of the supporting table and the storing device.

17. An apparatus for automatically resetting a printed-wiring-board supporting device including a supporting table and at least one supporting member which is set on a supporting surface of the supporting table to support a back surface of a printed wiring board, the apparatus comprising:

a storing device in which said at least one supporting member is stored;

a holding head which holds the supporting member;

a moving device which moves at least one of the holding head, the supporting table, and the storing device, relative to at least one other of the holding head, the supporting table, and the storing device; and a control device which includes a control-information memory in which prescribed control information is stored, and a computer including an information processor that processes the control information stored in the control-information memory, and which controls, according to the control information, the moving device so that the holding head takes the supporting member from a storing position in the storing device and sets the supporting member at a setting position on the supporting surface of the supporting table, and takes the supporting member from the setting position and stores the supporting member at the storing position, the computer further including at least one of (a) a first starting means for starting, in response to a start command supplied from a host computer, the information processor to process the control information, and (b) a second starting means for starting, in response to a start command input by an operator through an input device, the information processor to process the control information;

a recognizing device which recognizes a free end portion of the supporting member and obtains information relating to the free end portion, the moving device moving the recognizing device together with the holding head, relative to the wupporting table, the controls device further comprising a free-end-portion-relating-information-dependent control portion which controls the apparatus, based on the information, obtained by the recognizing device, relating to the free end portion of the supporting member; and a rotating device which rotates the holding head about an axis line thereof, wherein the free-end-portion-relating-information-dependant control portion comprises a rotating control portion which controls the rotating device, wherein the information obtained by the recognizing device comprises rotation-position information representing a rotation position of the supporting member as an angular phase thereof about an axis line thereof, and wherein the rotating control portion comprises a rotaion-position correcting portion which corrects, based on the rotation-position information, at least one of a rotation position of the holding head as an angular phase thereof about the axis line thereof and the rotation position of the supporting member held by the holding head.

18. A system for performing an operation relating a printed wiring board, comprising:

a printed-wiring-board supporting device comprising a supporting table and at least one supporting member which is set on a supporting surface of the supporting table to support a back surface of the printed wiring board;

an operation performing head which performs an operation for the printed wiring board supported by the printed-wiring-board supporting device;

a storing device in which said at least one supporting member is stored;

a holding head which holds the supporting member;

a first moving device which moves at least one of the holding head, the supporting table, and the storing device, relative to at least one other of the holding head, the supporting table, and the storing device; and a control device which controls, according to prescribed control information, the first moving device so that the holding head takes the supporting member from a storing position in the storing device and sets the supporting member at a setting position on the supporting surface of the supporting table, and takes the supporting member from the setting position and stores the supporting member at the storing position.

19. A system according to claim 18, further comprising a second moving device which moves at least one of the operation performing head and the printed-wiring-board supporting device, relative to the other of the operation performing head and the printed-wiring-board supporting device, so that the operation performing head performs said operation for the printed wiring board supported by the printed-wiring-board supporting device, wherein the control device comprises a first control portion which controls the first moving device, and a second control portion which controls the second moving device.

20. A system according to claim 19, further comprising a movable member which carries both the holding head and the operation performing head, wherein the second moving device shares at least a portion thereof with the first moving device.

21. A system according to claim 18, further comprising a supporting-member recognizing device which recognizes a free end portion of the supporting member positioned at at least one of the setting position and the storing position.

22. A system according to claim 18, further comprising a mark recognizing device which recognizes at least one fiducial mark provided on the printed wiring board supported by the printed-wiring-board supporting device.

23. A system according to claim 22, further comprising a supporting-member recognizing device which recognizes a free end portion of the supporting member positioned at at least one of the setting position and the storing position, wherein the supporting-member recognizing device is provided by the mark recognizing device.

24. A system according to claim 18, further comprising an electric-component supplying device which supplies at least one electric component, wherein the operation performing head comprises an electric-component mounting head which receives the electric component from the electric-component supplying device and mounts the component on the printed wiring board supported by the printed-wiring-board supporting device.

25. A system for performing an operation relating a printed wiring board, comprising:

a printed-wiring-board supporting device comprising a supporting table and at least one supporting member which is set on a supporting surface of the supporting table to support a back surface of the printed wiring board;

an operation performing head which performs an operation for the printed wiring board supported by the printed-wiring-board supporting device;

a storing device in which said at least one supporting member is stored;

a holding head which holds the supporting member;

a first moving device which moves at least one of the holding head, the supporting table, and the storing device, relative to at least one other of the holding head, the supporting table, and the storing device; and a control device which controls, according to prescribed control information, the first moving device so that the holding head takes the supporting member from a storing position in the storing device and sets the supporting member at a setting position on the supporting surface on the supporting table, and takes the supporting member from the setting position and stores the supporting member at the storing position, wherein the supporting table comprises a holding table which has an upper surface and a plurality of negative-pressure-supply holes each of which has an opening in the upper surface, wherein said at least one supporting member comprises at least one holding member which is attachable to the upper surface of the holding table such that a lower end surface of the holding member is held in close contact with a portion of the upper surface that surrounds the opening of at least one of the negative-pressure-supply holes, the holding member having a negative-pressure-passage which is formed therethrough, the holding member supporting, at an upper end surface thereof, the printed wiring board, and applying a negative pressure supplied from said at least one negative-pressure-supply hole via the negative-pressure-passage thereof, to the board and thereby holding the board, and wherein the printed-wiring-board supporting device further comprises a plurality of opening and closing valves which are associated with the plurality of negative-pressure-supply holes, respectively, each of the opening and closing valves closing a corresponding one of the negative-pressure-supply holes in a state in which the holding member is not attached to the portion of the upper surface of the holding table that surrounds the opening of said corresponding one negative-pressure-supply hole, and opening said corresponding one hole, in a state in which the holding member is attached to said portion of the upper surface, so that said corresponding one hole is communicated with the negative-pressure passage of the holding member.

26. An apparatus for automatically resetting a printed-wiring-board supporting device including a supporting table and at least one supporting member which is set on a supporting surface of the supporting table to support a back surface of a printed wiring board, the apparatus comprising:

a storing device in which said at least one supporting member is stored;

a holding head which holds the supporting member;

a moving device which moves at least one of the holding head, the supporting table, and the storing device, relative to at least one other of the holding head, the supporting table, and the storing device; and a control device which includes a control-information memory in which prescribed control information is stored, and a computer including an information processor that processes the control information stored in the control-information memory, and which controls, according to the control information, the moving device so that the holding head takes the supporting member from a storing position in the storing device and sets the supporting member at a setting position on the supporting surface of the supporting table, and takes the supporting member from the setting position and stores the supporting member at the storing position, the computer further including at least one of (a) a first starting means for starting, in response to a start command supplied from a host computer, the information processor to process the control information, and (b) a second starting means for starting, in response to a start command input by an operator through an input device, the information processor to process the control information, wherein the control information comprises information relating to whether the supporting member is a suction holding member which applies a negative pressure to the printed circuit board and thereby holds the board, or a non-suction supporting member which supports the board without applying a negative pressure thereto.

27. A system for performing an operation relating a printed wiring board, comprising:

a printed-wiring-board supporting device comprising a supporting table and at least one supporting member which is set on a supporting surface of the supporting table to support a back surface of the printed-wiring-board;

an operation performing head which performs an operation for the printed wiring board supported by the printed-wiring-board supporting device;

a storing device in which said at least one supporting member is stored;

a holding head which holds the supporting member;

a first moving device which moves at least one of the holding head, the supporting table, and the storing device, relative to at least one other of the holding head, the supporting table, and the storing device; and a control device which controls, according to prescribed control information, the first moving device so that the holding head takes the supporting member from a storing position in the storing device and sets the supporting member at a setting position on the supporting surface of the supporting table, and takes the supporting member from the setting position and stores the supporting member at the storing position, wherein the control information comprises information relating to whether the supporting member is a suction holding member which applies a negative pressure to the printed circuit board and thereby holds the board, or a non-suction supporting member which supports the board without applying a negative pressure thereto.

* * * * *